(12) United States Patent
Hatsuda

(10) Patent No.: US 9,305,627 B2
(45) Date of Patent: *Apr. 5, 2016

(54) RESISTANCE CHANGE TYPE MEMORY

(71) Applicant: KABUSHIKI KAISHA TOSHIBA, Minato-ku, Tokyo (JP)

(72) Inventor: Kosuke Hatsuda, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/739,047

(22) Filed: Jun. 15, 2015

(65) Prior Publication Data

US 2015/0279440 A1   Oct. 1, 2015

Related U.S. Application Data

(63) Continuation of application No. 13/965,142, filed on Aug. 12, 2013, now Pat. No. 9,093,148.

(60) Provisional application No. 61/804,524, filed on Mar. 22, 2013.

(51) Int. Cl.
*G11C 11/16* (2006.01)
*G11C 13/00* (2006.01)

(52) U.S. Cl.
CPC ............ *G11C 11/1673* (2013.01); *G11C 11/16* (2013.01); *G11C 11/1675* (2013.01); *G11C 13/004* (2013.01); *G11C 13/0069* (2013.01); *G11C 2213/79* (2013.01)

(58) Field of Classification Search
CPC ..... G11C 13/0069; G11C 13/004; G11C 11/16
USPC .................................................. 365/148, 158
See application file for complete search history.

(56) References Cited

U.S. PATENT DOCUMENTS

| | | | |
|---|---|---|---|
| 7,068,533 B2 * | 6/2006 | Ferrant et al. | 365/158 |
| 7,835,210 B2 | 11/2010 | Shimizu | |
| 8,199,597 B2 | 6/2012 | Ueda | |
| 8,279,692 B2 * | 10/2012 | Matsui | 365/203 |
| 8,284,595 B2 | 10/2012 | Nebashi et al. | |
| 8,472,242 B2 | 6/2013 | Shimomura et al. | |
| 2012/0069668 A1 | 3/2012 | Hatsuda | |
| 2012/0155146 A1 | 6/2012 | Ueda et al. | |
| 2012/0320665 A1 | 12/2012 | Ueda et al. | |

* cited by examiner

*Primary Examiner* — Huan Hoang
*Assistant Examiner* — Tri Hoang
(74) *Attorney, Agent, or Firm* — Holtz, Holtz & Volek PC

(57) ABSTRACT

According to one embodiment, a resistance change type memory includes a first and a second bit lines, a memory cell connected between the first and second bit lines and including a variable resistance element as a memory element and a first select element including a first control terminal connected to a word line, and an auxiliary circuit connected to the first bit line and including a second select element including a second control terminal connected to a control line. When data is read from the memory cell, a first current in a read current supplied to the first bit line is supplied to the memory element and the first select element, and a second current in the read current is supplied to the second select element.

17 Claims, 12 Drawing Sheets

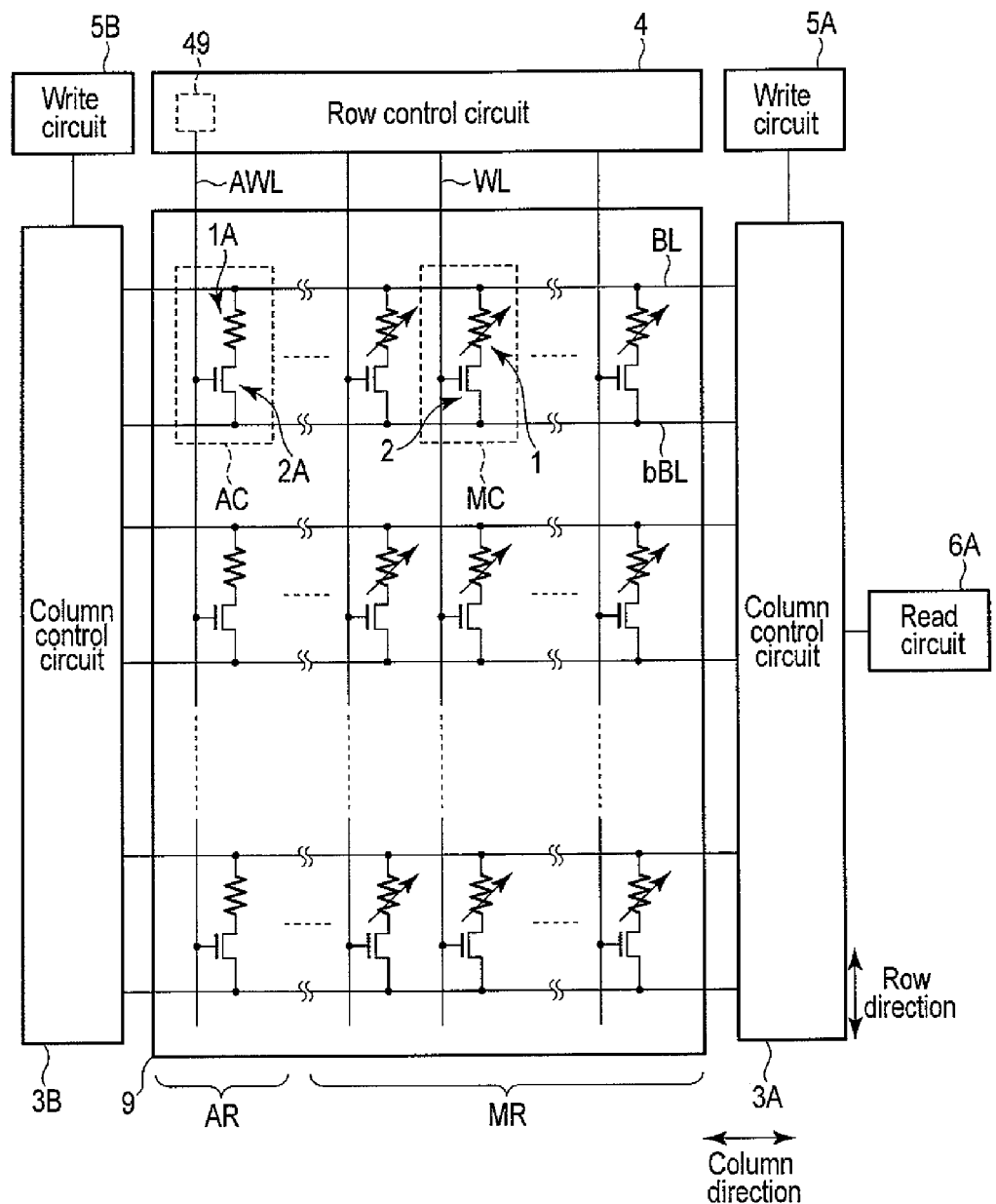
F I G. 1

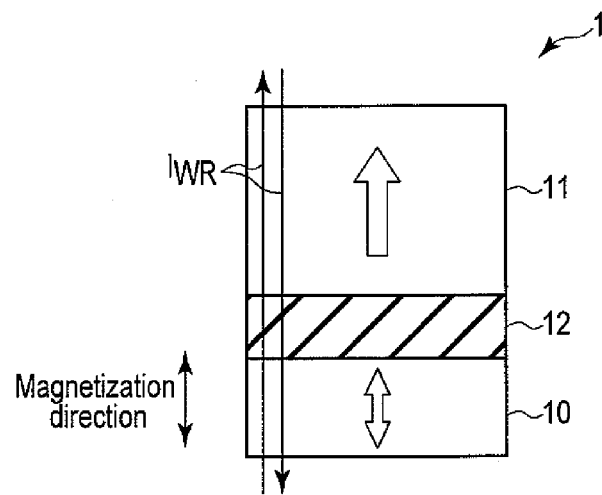
F I G. 2
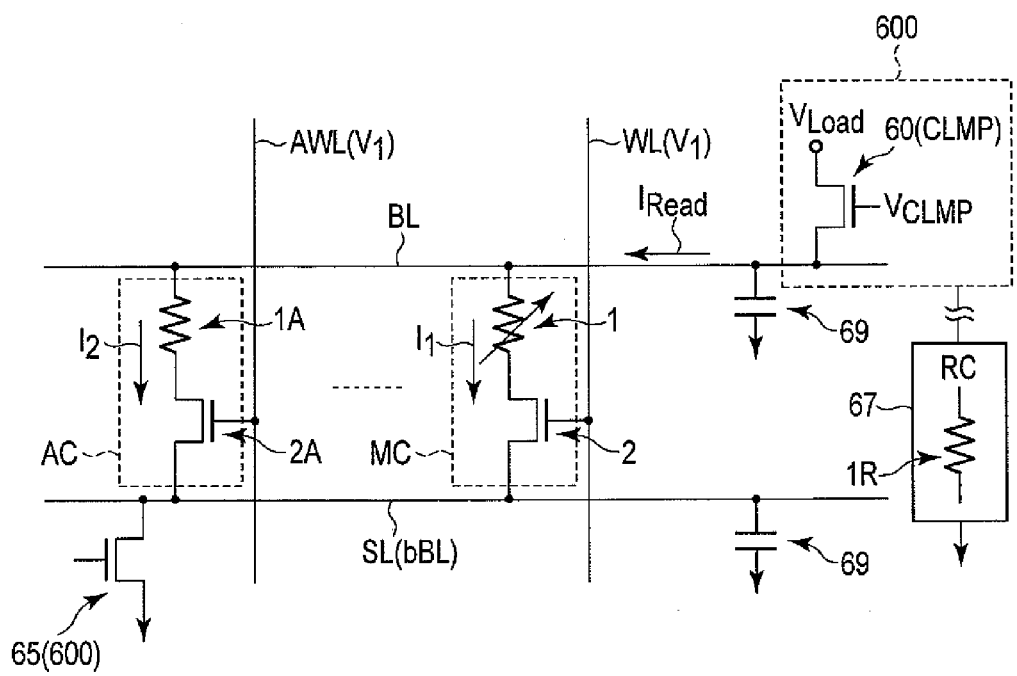
F I G. 4

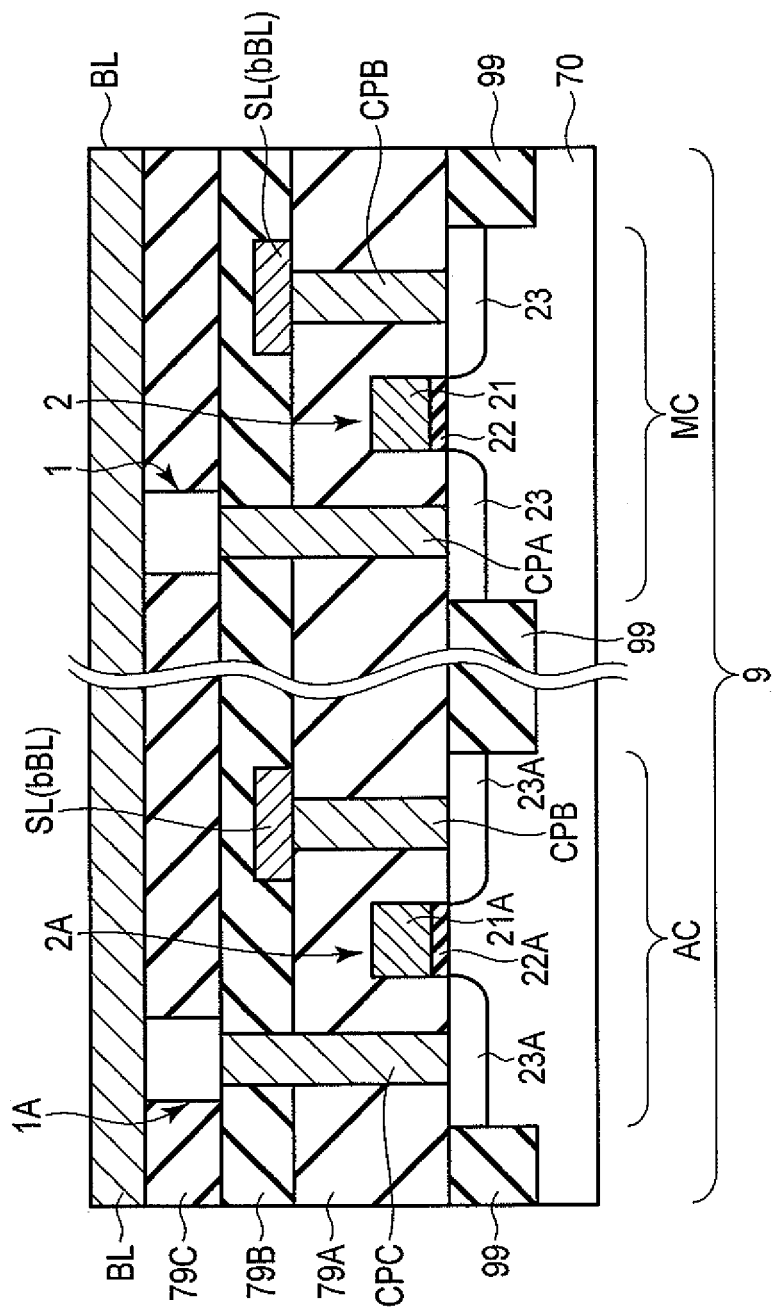
F I G. 3

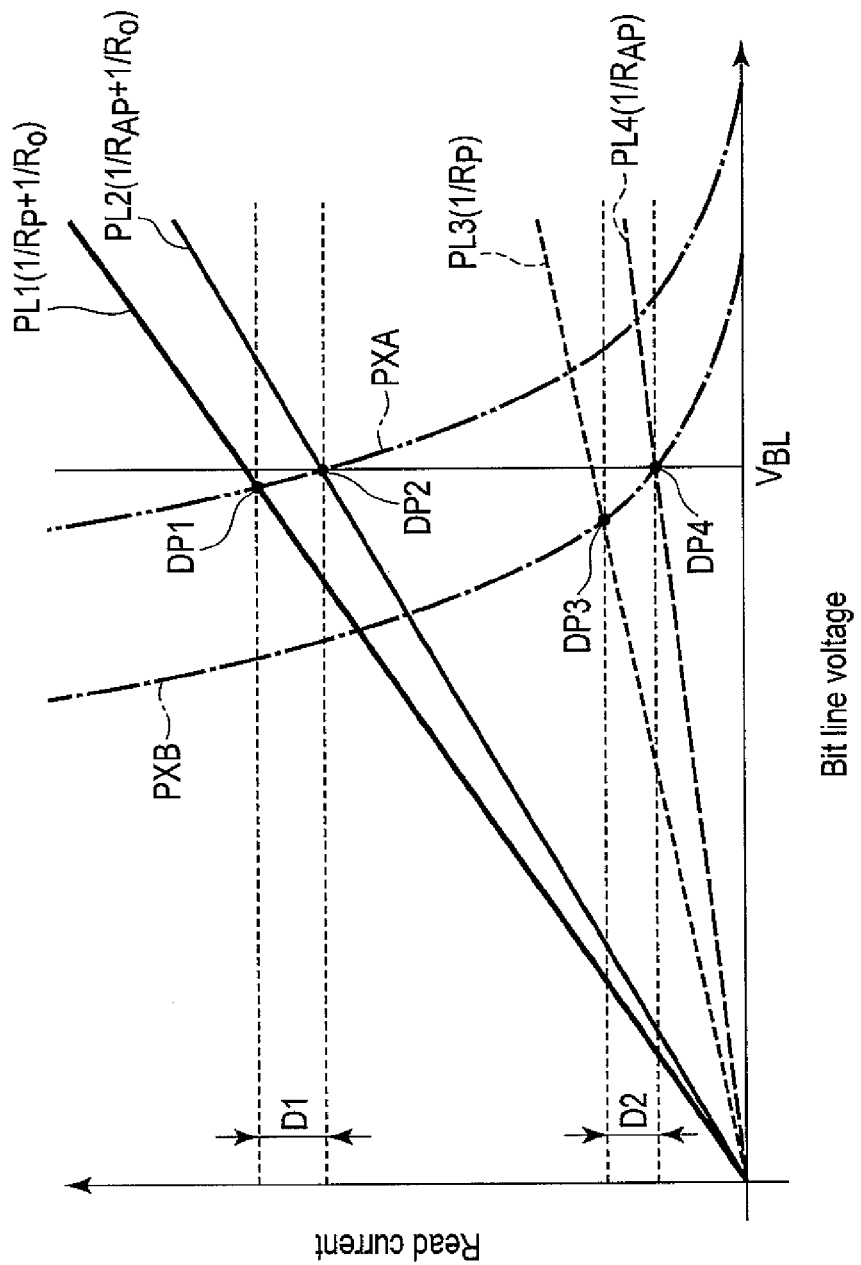
F I G. 5

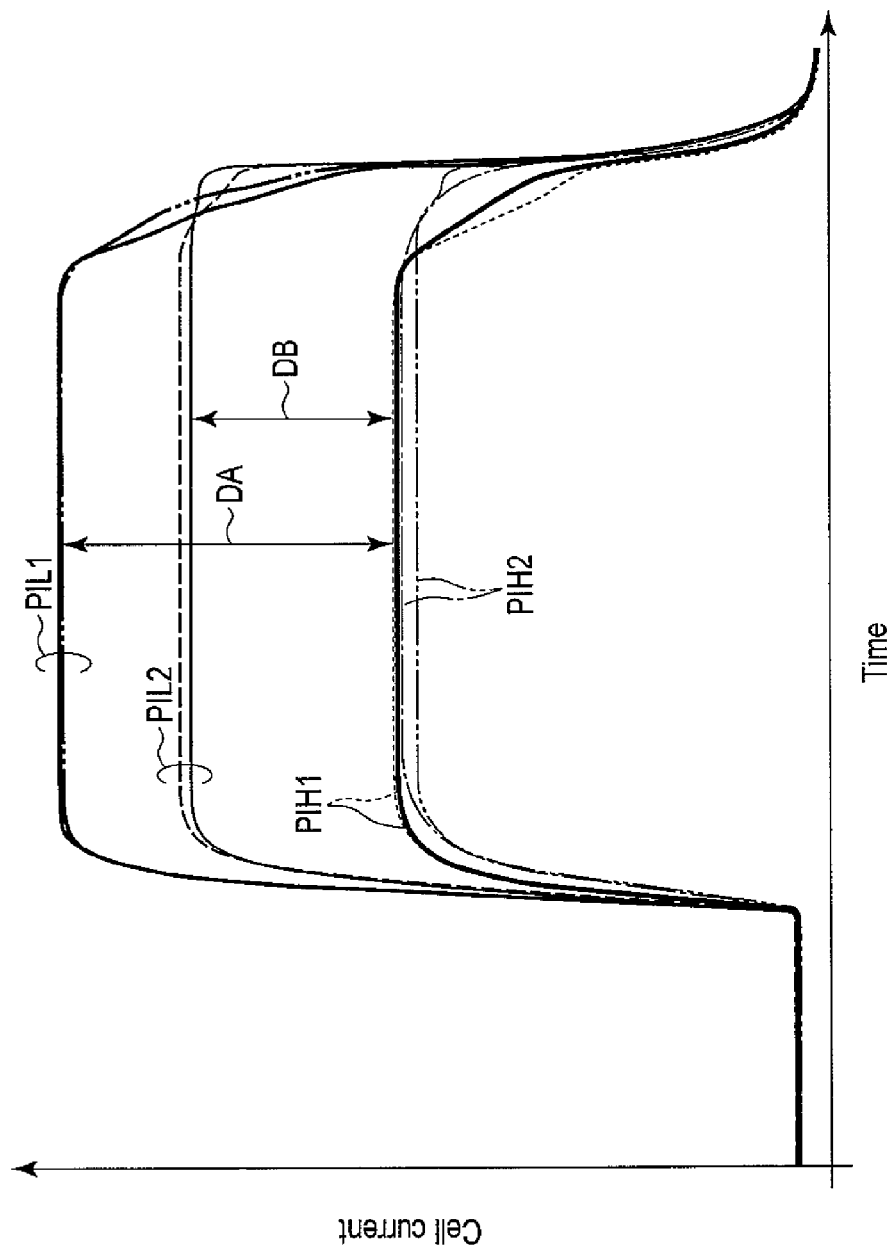
F I G. 6

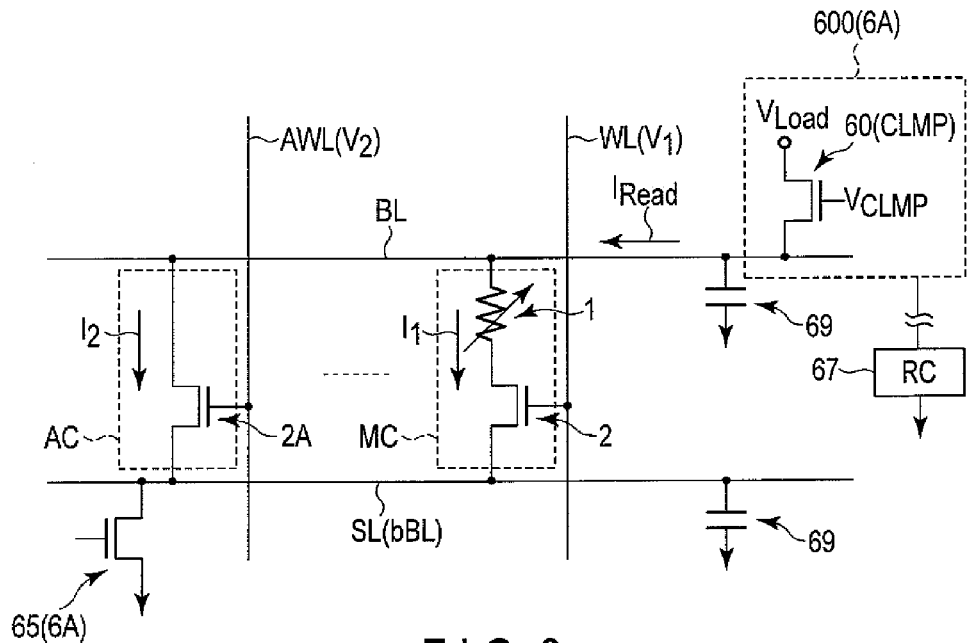
F I G. 8
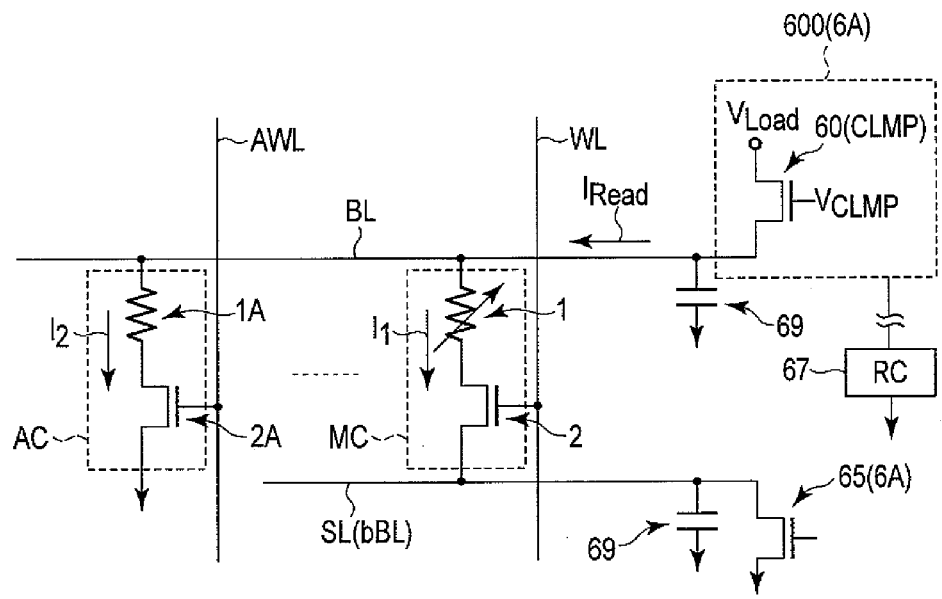
F I G. 9

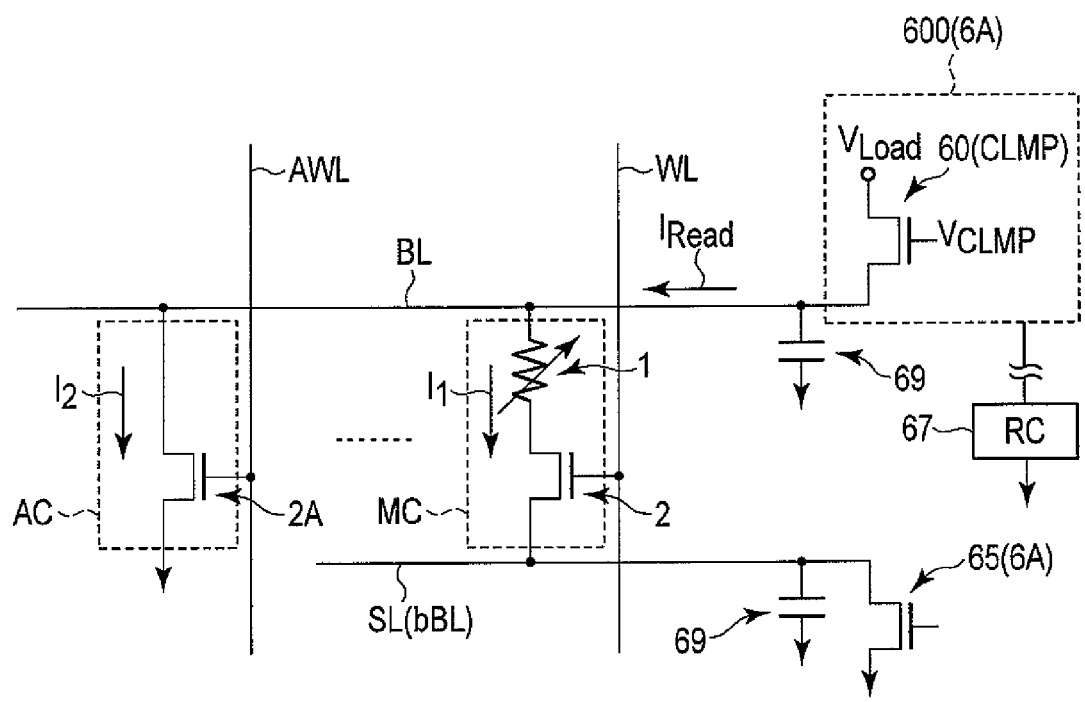
F I G. 10

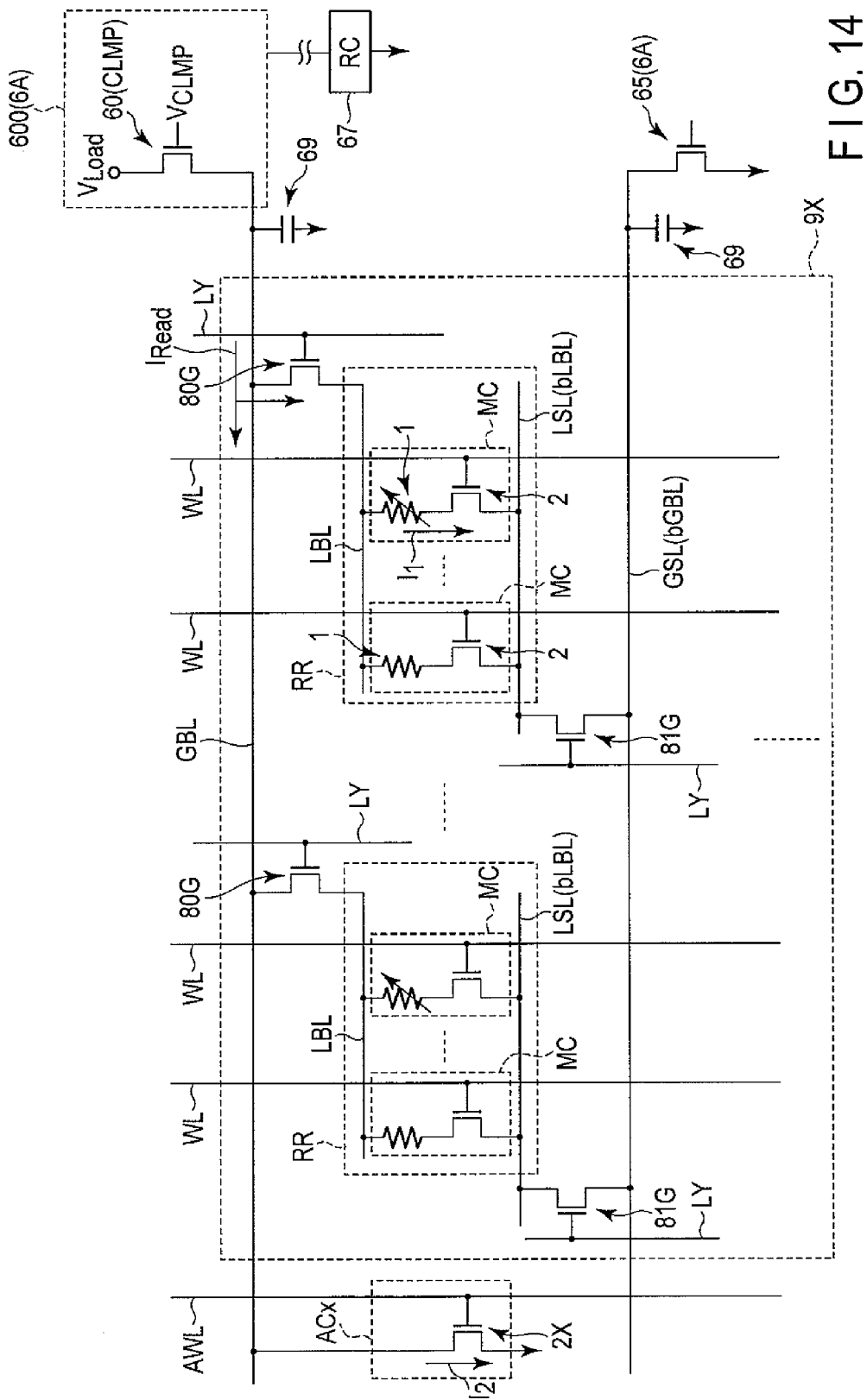
F I G. 14

RESISTANCE CHANGE TYPE MEMORY

CROSS-REFERENCE TO RELATED APPLICATIONS

This application is a Continuation application of U.S. Ser. No. 13/965,142, filed Aug. 12, 2013 (now U.S. Pat. No. 9,093,148, issued Jul. 28, 2015), which claims the benefit of U.S. Provisional Application No. 61/804,524, filed Mar. 22, 2013, the entire contents of both of which are incorporated herein by reference.

FIELD

Embodiments described herein relate generally to resistance change type memory.

BACKGROUND

Resistance change type memories, such as an MRAM (magnetoresistive random-access memory), an ReRAM (resistive random-access memory), and a PCRAM (phase-change random-access memory) have been gaining prominence as next-generation semiconductor memories. Since miniaturization of elements is relatively easy in such resistance change type memories, increase in storage density and reduction in power consumption can be achieved.

In such resistance change type memories, reliability in writing data and reading data is required.

BRIEF DESCRIPTION OF THE DRAWINGS

FIG. 1 schematically illustrates an overall configuration of a resistance change type memory.

FIG. 2 illustrates an exemplary structure of a memory element of the resistance change type memory.

FIG. 3 is a cross-sectional view illustrating an exemplary structure of the resistance change type memory.

FIG. 4 illustrates an exemplary inner configuration of a resistance change type memory according to a first embodiment.

FIG. 5 illustrates operating characteristics of the resistance change type memory according to the embodiment.

FIG. 6 illustrates operating characteristics of the resistance change type memory according to the embodiment.

FIG. 8 illustrates an exemplary inner configuration of a resistance change type memory according to a second embodiment.

FIG. 9 illustrates an exemplary inner configuration of a resistance change type memory according to a third embodiment.

FIG. 10 illustrates an exemplary inner configuration of the resistance change type memory according to the third embodiment.

FIG. 14 illustrates an exemplary inner configuration of the resistance change type memory according to the fifth embodiment.

DETAILED DESCRIPTION

Figure 7:
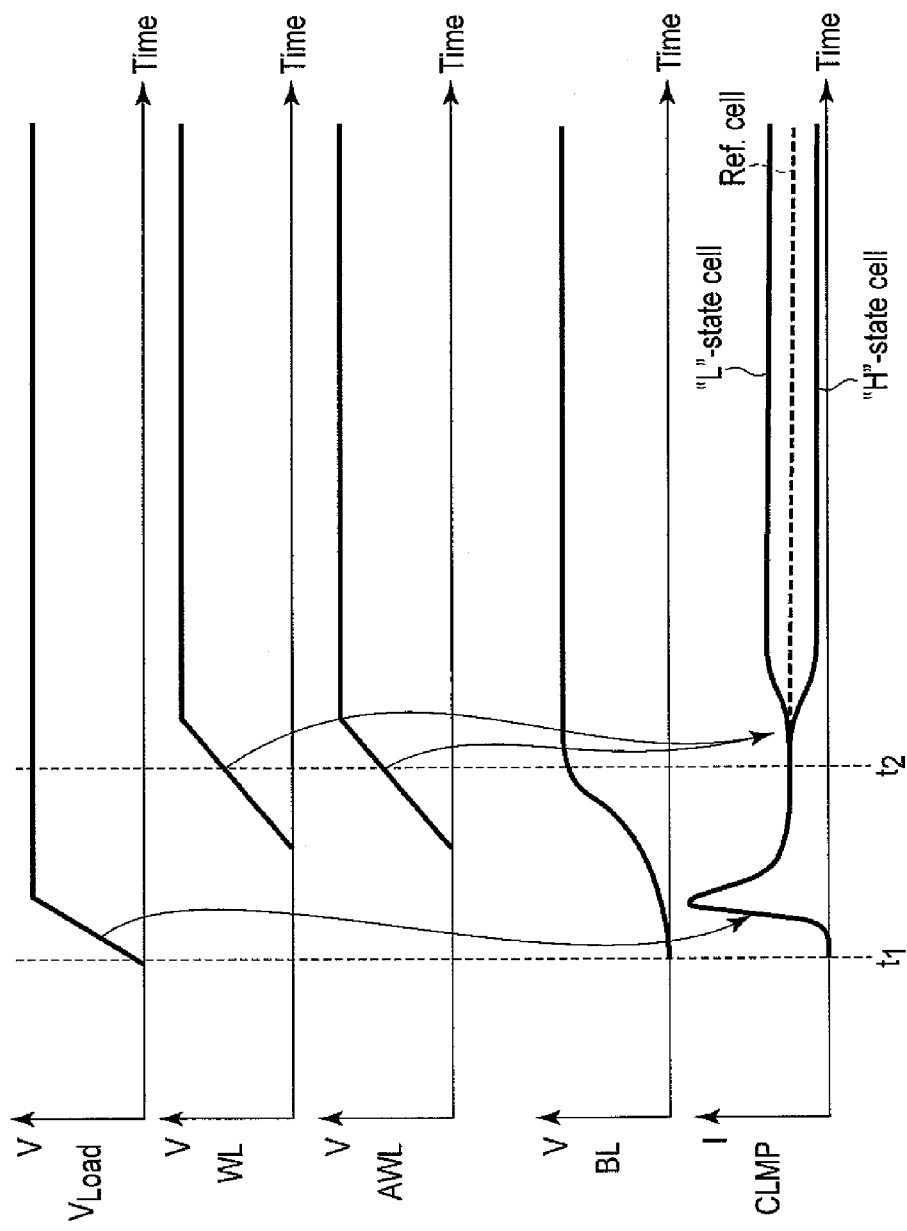
FIG. 7 illustrates an exemplary operation of the resistance change type memory according to the first embodiment.

Hereinafter, embodiments will be described with reference to the accompanying drawings. In the descriptions that follow, structural elements having the same function and configuration will be denoted by the same reference numbers, and repetitive description will be given only when necessary.

In general, according to one embodiment, a resistance change type memory includes: a first and a second bit lines extending in a first direction; a first word line extending in a second direction; a first control line extending in the second direction; a memory cell connected between the first and second bit lines and including a variable resistance element as a memory element and a first select element including a first control terminal connected to the first word line; and an auxiliary circuit connected to the first bit line and including a second select element including a second control terminal connected to the first control line. When reading data from the memory cell, a read current is supplied to the first bit line, the memory cell and the auxiliary circuit are turned on, a first current included in the read current is supplied to the memory element and the first select element, and a second current included in the read current is supplied to the second select element.

(1) First Embodiment

A resistance change type memory according to a first embodiment will be described with reference to FIGS. 1 to 7.

(a) Configuration

A configuration of the resistance change type memory according to the first embodiment will be described with reference to FIGS. 1 to 6.

FIG. 1 schematically shows a memory cell array of the resistance change type memory and a circuit configuration in the vicinity thereof, according to the present embodiment.

As shown in FIG. 1, a memory cell array 9 includes a plurality of memory cells MC.

The plurality of memory cells MC are arranged in an array pattern in the memory cell array 9. A plurality of bit lines BL, bBL and a plurality of word lines WL are provided in the memory cell array 9. The bit lines BL, bBL extend in a column direction, and the word lines WL extend in a row direction. Two bit lines BL, bBL form a pair of bit lines.

The memory cell MC is connected to the bit lines BL, bBL, and the word line WL.

A plurality of memory cells MC arranged in the column direction are connected to a common pair of bit lines BL, bBL. A plurality of memory cells MC arranged in the row direction are connected to a common word line WL.

The memory cell MC includes one resistance-change element 1 as a memory element and one select switch 2, for example. A resistance state of the resistance-change element 1 changes by being given a current, a voltage, or energy (heat, for example) of a certain threshold value of greater.

When the resistance change type memory is an STT (spin-transfer torque)-MRAM, for example, a magnetoresistive effect element is used as the resistance-change element as a memory element.

FIG. 2 is a cross-sectional view illustrating an exemplary structure of the magnetoresistive effect element. The magnetoresistive effect element 1 as the resistance-change element (memory element) 1 includes: a magnetic layer 10 whose direction of magnetization is variable; a magnetic layer 11 whose direction of magnetization is fixed (invariable); and a non-magnetic layer 12 between the two magnetic layers 10, 11.

In the description that follows, the magnetic layer 10 whose direction of magnetization is variable will be referred to as a storage layer (also referred to as a recording layer or a magnetization free layer) 10. The magnetic layer 11 whose direction of magnetization is invariable will be referred to as a reference layer (also referred to as a pin layer, a pinned layer, or a magnetization invariable layer) 11. The non-magnetic layer 12 will be referred to as a tunnel barrier layer 12.

The storage layer 10, the tunnel barrier layer 12, and the reference layer 11 form a magnetic tunneling junction. In the description that follows, a magnetoresistive effect element 1 including the magnetic tunneling junction will be referred to as an MTJ element 1.

The two magnetic layers 10, 11 have magnetic anisotropy in a vertical direction relative to a film surface of the magnetic layers 10, 11, and magnetization of the two magnetic layers 10, 11 is directed toward the vertical direction relative to the film surface. By using the magnetic layers having magnetization directed toward the vertical direction relative to the film surface in the MTJ element, miniaturization of the memory element and the memory cells of the resistance change type memory is achieved.

The direction of magnetization of the storage layer 10 is changed by letting a predetermined current flow through the MTJ element 1. According to change in direction of magnetization of the storage layer 10, relative alignment of magnetization of the storage layer 10 and the reference layer 11 changes, and the MTJ element 1 is switched between a high-resistance state and a low-resistance state.

When the direction of magnetization of the storage layer 10 and the direction of magnetization of the reference layer 11 in the MTJ element 1 are opposite to each other (i.e., in an antiparallel state), the MTJ element 1 is switched to a high-resistance state. When the direction of magnetization of the storage layer 10 and the direction of magnetization of the reference layer 11 in the MTJ element are the same (i.e., in a parallel state), the MTJ element 1 is switched to a low-resistance state.

By letting the resistance state of the MTJ element 1 be associated with data to be stored, the MTJ element 1 is used as a memory element.

The select switch 2 is a field-effect transistor, for example. In the description that follows, the field-effect transistor as the select switch 2 will be referred to as a select transistor 2.

One end of the resistance-change element 1 is connected to the bit line BL, and the other end of the resistance-change element 1 is connected to one end (source/drain) of a current path of the select transistor 2. The other end (drain/source) of the current path of the select transistor 2 is connected to the bit line bBL. A control terminal (gate) of the select transistor 2 is connected to the word line WL.

One end of the word line WL is connected to a row control circuit 4. The row control circuit 4 controls whether to activate or inactivate the word line WL on the basis of an address signal from outside.

Column control circuits 3A, 3B are connected to one end and the other end of the bit lines BL, bBL. The column control circuits 3A, 3B control whether to activate or inactivate the bit lines BL, bBL on the basis of an address signal from outside.

Write circuits 5A, 5B are connected to one end and the other end of the bit lines BL, bBL via the column control circuits 3A, 3B, respectively. Each of the write circuits 5A, 5B includes a source circuit such as a current source and a voltage source for generating a write pulse (write voltage or write current) and a sink circuit for absorbing the write pulse.

In the resistance change type memory, the write circuits 5A, 5B supply a memory cell (hereinafter referred to as a select cell) selected from outside with a write pulse when writing data.

When the resistance change type memory of the present embodiment is an STT-MRAM, for example, when writing data to the MTJ element 1, the write circuits 5A, 5B let a write current as a write pulse flow in both directions of the MTJ element 1 in the memory cell MC according to the data to be written to the select cell. That is, a write current traveling from the bit line BL toward the bit line bBL or a write current traveling from the bit line bBL toward the bit line BL is output from the write circuits 5A, 5B, according to the data to be written to the MTJ element 1.

Change in resistance state of the MTJ element 1 using an STT is performed by letting a current flow through the MTJ element 1. As shown in FIG. 2, a write current $I_{WR}$ flowing from the storage layer 10 toward the reference layer 11 or a current $I_{WR}$ flowing from the reference layer 11 toward the storage layer 10 is supplied to the MTJ element 1, according to data to be written (i.e., resistance state of the MTJ element that should be changed).

A magnetization reversal threshold value of the reference layer 11 is set greater than a magnetization reversal threshold value of the storage layer 10, such that a direction of magnetization of the reference layer 10 does not change when a current is supplied that changes the direction of magnetization of the storage layer 10. By letting a current of a magnitude greater than the magnetization reversal threshold value of the storage layer 10 of the MTJ element 1 and less than the magnetization reversal threshold value of the reference layer 10 be supplied to the MTJ element 1 as a write current (write pulse) $I_{WR}$, the relative directions of magnetization of the storage layer 10 and the reference layer 11 are reversed. Thereby, the resistance value of the MTJ element 1 is changed, and predetermined data is written to the MTJ element 1 as a memory element.

A read circuit 6A is connected to one end of the bit lines BL, bBL via the column control circuits 3A, 3B. The read circuit 6A includes a voltage source or a current source which generates a read current, a sense amplifier which detects and amplifies a read signal, a latch circuit which temporarily holds data, and the like. The read circuit 6A supplies the select cell with a read current when reading data from the MTJ element 1. A current value of the read current is smaller than a current value (magnetization reversal threshold value) of the write current, such that magnetization of the storage layer will not be reversed by the read current.

The current value or potential at a read node differs according to a magnitude of the resistance value of the MTJ element 1 to which a read current is supplied. Data stored in the MTJ element 1 is determined on the basis of an amount of variation (read signal; read output) determined according to the magnitude of the resistance value.

In the example shown in FIG. 1, the read circuit 6A is provided at one end of the memory cell array 9 in the column direction, but two read circuits may be provided at each of one end and the other end of the memory cell array 9 in the column direction.

The column control circuits 3A, 3B, the row control circuit 4, the write circuits 5A, 5B, and the read circuit 6 are provided on the same chip as the memory cell array 9, and are provided in a peripheral region in the vicinity of the memory cell array 9. For example, a buffer circuit, a state machine (control circuit), or an error checking and correcting (ECC) circuit, for example, may be provided on the same chip as the memory cell array 9.

The resistance change type memory according to the present embodiment comprises an auxiliary circuit AC which is driven when reading data from a selected memory cell MC and assists reading of the data from the memory cell MC.

In the present embodiment, the auxiliary circuit AC has a structure substantially the same as that of the memory cell MC. In the description that follows, the auxiliary circuit AC will be referred to as an assist cell AC, or a read assist circuit AC.

FIG. 3 is a cross-sectional view illustrating an exemplary structure of the memory cell and the assist cell included in the resistance change type memory according to the present embodiment.

As shown in FIGS. 1 and 3, the assist cell (auxiliary circuit) AC is provided in the memory cell array 9, for example. The memory cell MC is provided in a cell array region MR in the memory cell array 9, and the assist cell AC is provided in the assist cell array region AR in the memory cell array 9.

As shown in FIG. 3, the memory cell MC and the assist cell AC are provided in an active region partitioned by an element isolation insulating film 99 in the memory cell array 9.

As described above, the memory cell MC includes one resistance-change element (memory element) 1 and a field-effect transistor (select transistor) 2.

The select transistor 2 includes a gate insulating film 22 on a semiconductor substrate 70, a gate electrode 21 on the gate insulating film 22, and source/drains 23 provided in the semiconductor substrate (active region) 70. The gate electrode 21 of the select transistor 2 extends in the row direction, and becomes a common gate among a plurality of select transistors 2 arranged in the row direction. The gate electrode 21 functions as a word line.

A surface of the semiconductor substrate 70 is covered with interlayer insulating films 79A, 79B, 79C.

The resistance-change element 1 is provided in the interlayer insulating film 79C. One end of the resistance-change element 1 is connected to the bit line BL on the interlayer insulating film 79C. The other end of the resistance-change element 1 is connected to one of the source/drains (source/drain diffusion layers) 23 of the select transistor 2 via a contact plug CPA embedded in the interlayer insulating films 79A, 79B. The other of the source/drains 23 of the select transistor 2 is connected to the bit line bBL in the interlayer insulating film 79B via a contact plug CPB in the interlayer insulating film 79A.

The assist cell AC is connected to the same bit lines BL, bBL as the memory cell MC. That is, an assist cell AC is connected to each pair of bit lines BL, bBL. The number of assist cells AC connected to a pair of bit lines BL, bBL may be one or greater than one.

The assist cell AC includes one resistance element 1A and a field-effect transistor 2A. In the description that follows, the field-effect transistor in the assist cell AC will be referred to as an assist transistor 2A.

The resistance element 1A is an element formed at the same time with the resistance-change element 1A as a memory element, for example. In this case, the resistance element 1A is a resistance-change element. The resistance element 1A is provided in the interlayer insulating film 79C.

The assist transistor 2A is an element formed at the same time with the select transistor 2. The assist transistor 2A includes a gate insulating film 22A on the semiconductor substrate 70, a gate electrode 21A on the gate insulating film 22A, and source/drains 23A provided in the semiconductor substrate 70.

One end of the resistance element 1A is connected to the bit line BL on the interlayer insulating film 79C. The other end of the resistance-change element 1A is connected to one of the source/drains 23A of the assist transistor 2A via a contact plug CPC provided in the interlayer insulating films 79A, 79B. The other of the source/drains 23A of the assist transistor 2A is connected to the bit line bBL in the interlayer insulating film 79B via a contact plug CPD.

A plurality of assist cells AC arranged in the row direction are connected to a common control line AWL. The control line AWL is connected to a gate of the assist transistor 2A. By controlling a voltage (potential) which is applied to the control line AWL, the assist transistor 2A is driven, and operation (on/off) of the assist cell AC is controlled.

The gate electrode 21A of the assist transistor 2A extends in the row direction and becomes a common gate among the plurality of assist transistors 2A arranged in the row direction. The gate electrode 21A of the assist transistor 2A functions as the control line AWL.

In the description that follows, the control line AWL, designed to control whether to turn on or off the assist cell AC, will be referred to as an assist word line AWL.

For example, the control line AWL is controlled by an assist word line control unit provided in the row control circuit 4.

As described above, the assist cell AC has a structure substantially the same as that of the memory cell MC. The assist cell AC and the memory cell MC can be simultaneously formed in substantially the same manufacturing step. Accordingly, even if the resistance change type memory has a circuit configuration including the assist cell AC, increase in manufacturing steps hardly occurs, and hence increase in manufacturing cost of the resistance change type memory hardly occurs.

The select transistor 2 and the assist transistor 2A shown in FIG. 3 are field-effect transistors with a planar structure; however, the configuration of the select transistor and the assist transistors 2, 2A is not limited thereto. A field-effect transistor with a three-dimensional structure, such as a recess channel array transistor (RCAT) and a FinFET, for example, may be used as the select transistor. An RCAT has a structure in which a gate electrode is embedded in a groove (recess) in a semiconductor region via a gate insulating film. A FinFET has a structure in which a gate electrode three-dimensionally crosses an oblong-shaped semiconductor region (fin) via a gate insulating film. The assist cell AC may be a resistance element formed of polysilicon. A polysilicon layer provided on the substrate 70 may be used as a resistance element of the assist cell AC, for example. A polysilicon layer may be provided in the interlayer insulating film 79C, in which a resistance-change element (MTJ element) is provided, after the resistance-change element (MTJ element) in the assist cell AC is removed. A diffusion layer provided in the semiconductor substrate 70 may be used as a resistance element of the assist cell AC.

When a memory cell MC connected to a pair of bit lines BL, bBL is selected as a target to which data is to be written, the assist cell AC is turned off, and the assist cell AC is electrically separated from the pair of bit lines BL, bBL to which a select cell is connected.

When a memory cell MC connected to a pair of bit lines is selected as a target from which data is to be read, the assist cell AC connected to the same pair of bit lines BL, bBL as the select cell is turned on. A part of a read current supplied to the bit line BL is supplied to the select cell MC, and the remaining part of the read current is supplied to the assist cell AC.

A circuit configuration and an operation of the resistance change type memory of the present embodiment when reading data will be described in further detail with reference to FIG. 4.

FIG. 4 illustrates an operation of a select cell and an assist cell connected to a pair of bit lines in a resistance change type memory when reading data, according to the present embodiment.

As described above, a plurality of memory cells MC are connected between two bit lines BL, bBL forming a pair of bit lines.

An assist cell (auxiliary circuit) AC is connected between the bit lines BL, bBL, between which the plurality of memory cells MC are connected.

When data is read, one bit line of the pair of bit lines BL, bBL is set to a high potential ("H" level), and the other bit line bBL is set to a low potential ("L" level). In the description that follows, the bit line (bit line bBL in this case) on the low-potential side of the pair of bit lines BL, bBL selected when data is read will be referred to as a source line SL, and the bit line (bit line BL in this case) on the high-potential side will be simply referred to as a bit line, for the sake of clarification.

In the description that follows, a bit line on the low-potential side of the pair of bit lines BL, bBL selected when data is written may also be referred to as a source line.

When data is read, the pair of bit lines BL, bBL, to which a selected memory cell MC is connected, is connected to the read circuit 6A and the sense amplifier 600. A read current $I_{Read}$ from the read circuit 6A is supplied to the pair of bit lines BL, bBL.

The bit line BL on the high-potential side is connected to one end of a current path of a field-effect transistor 60 (CLMP), designed to control the read current $I_{Read}$ supplied to the bit line BL. The other end of the current path of the field-effect transistor 60 is connected to a potential end of the read circuit 6A. A potential (load voltage, current generation voltage) $V_{Load}$, designed to generate a read current $I_{Read}$, is applied to the other end of the current path of the field-effect transistor 60. A voltage (clamp voltage) $V_{CLMP}$, designed to control a current which is supplied to the bit line BL, is applied to a gate of the transistor 60. In the description that follows, the transistor 60, designed to control supply of the read current $I_{Read}$, will be referred to as a clamp transistor 60, for the sake of clarification.

As the clamp transistor 60 controls the read current $I_{Read}$, the voltage (hereinafter referred to as a bit line voltage) of the bit line is controlled to a predetermined voltage value (0.3 V, for example).

When data is read, the bit line BL and the select cell are connected to one of input terminals of the sense amplifier 69 in the read circuit 6A, and a reference cell 67 is connected to the other input terminal of the sense amplifier 69. The reference cell 67 includes a resistance element 1R, which is used as a standard based on which data (resistance value) of the memory element 1 in the select cell MC is determined. A standard current (or a standard potential) used to read data is generated on the basis of the reference cell 67.

The reference cell 67 may be provided in the memory cell array 9. The reference cell 67 includes a resistance element 1R and a field-effect transistor as a select element, for example. The other input terminal of the sense amplifier 69 may be connected to a ground terminal, or connected to the source line SL.

The source line SL (bit line bBL on the low-potential side) is connected to one end of a current path of a field-effect transistor 65, designed to absorb the read current $I_{Read}$. A ground terminal (ground line) is connected to the other end of the current path of the field-effect transistor 65. In the description that follows, the transistor 65, designed to absorb the read current $I_{Read}$, will also be referred to as a sink transistor 65, for the sake of clarification.

A capacitor 69 designed to stabilize a potential of the interconnect or a parasitic capacitance, is connected to the bit line BL and the source line SL (bBL).

The assist cell AC should preferably be connected between the bit lines BL, bBL at a farthest point on the side opposite to the side of a supply source (the sense amplifier 600) of the read current $I_{Read}$.

Elements used to read data from the memory cell MC, such as the clamp transistor 60, the sink transistor 65, and the capacitor 69, are provided in the read circuit 6A. Each of the elements 60, 65, 69 is electrically connected to the bit lines BL, bBL and the memory cell MC at a predetermined timing when data is read. Each of the elements 60, 65, 69 is electrically separated from the bit lines BL, bBL and the memory cell MC during operation other than data reading.

A current of a magnitude corresponding to the resistance value of the resistance-change element 1 in the select cell is obtained by currents $I_{Read}$, $I_1$ supplied from the clamp transistor 60 to the bit line BL and the select cell MC. The resistance value of the resistance-change element 1 is thus converted into a value of a current flowing through the resistance-change element 1 when data is read in the resistance change type memory.

When restrictions are imposed on the magnitude of the current flowing through the resistance-change element 1, by letting the magnitude of the clamp voltage $V_{CLMP}$ applied to the gate of the clamp transistor 60 be controlled, the clamp transistor 60 controls a current which is supplied to the bit line BL.

When data is read, the assist cell AC connected to the pair of bit lines BL, SL (bBL), to which the select cell MC is also connected, is driven, in addition to the select cell MC. That is, a gate voltage $V_1$ (potential of "H" level), which switches the select transistor 2 in the select cell MC to an ON state, is applied to the word line WL, and a gate voltage $V_1$ (potential of "H" level), which switches the assist transistor 2A in the assist cell AC to an ON state, is applied to the assist word line WL. Thereby, the select cell MC and the assist cell AC are connected to the read circuit 6A.

The read current $I_{Read}$ supplied to the bit line BL from the clamp transistor 60 is supplied to the select cell (memory cell) MC and to the assist cell AC. The read current $I_{Read}$ from the clamp transistor 60 branches off into the select cell MC and the assist cell AC, and flows through the select cell MC and the assist cell AC.

A current $I_1$, which is a part of the read current $I_{Read}$, is supplied to the select cell MC, and flows through the resistance-change element 1 as a memory element. A current $I_2$, which is a part of the read current $I_{Read}$, is supplied to the assist cell AC, and flows through the resistance element 1A. In the description that follows, the current $I_1$ flowing through the select cell MC when data is read from the select cell will be referred to as a cell current $I_1$, and the current $I_2$ flowing through the assist cell AC will be referred to as an assist current $I_2$, for the sake of clarification.

The sense amplifier 600 compares the magnitudes of the cell current $I_1$ flowing through the memory cell MC and the current (standard current; inconstant current) flowing through the reference cell RC, and determines data to be stored in the memory cell MC. Based on the determination result, data is read from the memory cell MC.

As described above, when the assist cell AC has a configuration substantially the same as that of the memory cell MC, the resistance element 1A in the assist cell AC is a resistance-change element. Accordingly, the magnitude of the assist current $I_2$ can be adjusted according to the resistance state of the resistance element 1A.

To increase in charging speed of the bit line BL, for example, the assist current $I_2$ should preferably be increased, for example, to be greater than the cell current $I_1$. To reduce the power consumption of the resistance change type memory, the assist current $I_2$ should preferably be decreased, for example, to be less than the cell current $I_1$.

In the resistance change type memory of the present embodiment, the read current $I_{Read}$ is represented by the sum of the cell current $I_1$ and the assist current $I_2$, i.e., $I_{Read}=I_1+I_2$.

A current value of the cell current $I_1$ is determined according to the resistance state (high-resistance state/low-resistance state) of the resistance-change element (memory element) 1 in the select cell and a voltage (bit line voltage) of the bit line BL.

When the characteristics of the resistance-change element 1 and the bit line voltage in the present embodiment are set the same as those of a general resistance change type memory not including an assist cell AC, the magnitude of the cell current $I_1$ in the resistance change type memory of the present embodiment becomes the same as a magnitude of a cell current flowing through a select cell in the general resistance change type memory.

In this case, the magnitude of the read current $I_{Read}$ in the resistance change type memory of the present embodiment increases according to the magnitude of the assist current $I_2$. That is, even if the read current $I_{Read}$ which is supplied to the bit line BL increases, the cell current $I_1$ flowing through the select cell MC need not be increased.

Operating characteristics of the resistance change type memory according to the present embodiment when reading will be described with reference to FIGS. 5 and 6.

FIG. 5 is a graph indicating a relationship between a bit line voltage $V_{BL}$ and a read current $I_{Read}$ of the resistance change type memory when reading data.

The horizontal axis of FIG. 5 represents the bit line voltage, and the vertical axis of FIG. 5 represents the read current $I_{Read}$.

The characteristic lines PL1, PL2 of FIG. 5 represent a relationship between the bit line voltage and the read current in the resistance change type memory including the assist cell AC of the present embodiment. The characteristic line PL1 represents a relationship between the bit line voltage and the read current when the resistance state of the resistance element in the select cell (memory cell) is a low-resistance state. The characteristic line PL2 represents a relationship between the bit line voltage and the read current when the resistance state of the resistance element in the select cell (memory cell) is a high-resistance state.

The characteristic lines PL3, PL4 of FIG. 5 represent a relationship between the bit line voltage and the read current of a general resistance change type memory not including an assist cell AC. The characteristic line PL3 represents a relationship between the bit line voltage and the read current when the resistance state of the resistance element in the select cell (memory cell) is a low-resistance state. The characteristic line PL4 represents a relationship between the bit line voltage and the read current when the resistance state of the resistance element in the select cell (memory cell) is a high-resistance state.

In the description that follows, the memory cell including a resistance-change element in a low-resistance state will be referred to as a low-resistance-state cell, and the memory cell including a resistance-change element in a high-resistance state will be referred to as a high-resistance-state cell, for the sake of clarification.

A characteristic line PXA of FIG. 5 schematically shows operating characteristics (change in operating points) of the clamp transistor relative to the bit line voltage in the resistance change type memory including the assist cell AC according to the present embodiment. A characteristic line PXB of FIG. 5 schematically shows operating characteristics (change in operating points) of the clamp transistor relative to the bit line voltage in a resistance change type memory not including an assist cell AC. As described above, the clamp transistor is a transistor which controls a read current which is supplied to the bit line BL.

The resistance value of the resistance-change element in a low-resistance state of the memory cell will be denoted by $R_P$, and the resistance value of the resistance change element in a high-resistance state of the memory cell will be denoted by $R_{AP}$. The resistance value of the resistance element in the assist cell will be denoted by $R_0$.

When a resistance change type memory includes an assist cell as in the present embodiment, a gradient of the characteristic line PL1 when the resistance-change element is in a low-resistance state is expressed by $1/R_P+1/R_0$, and a gradient of the characteristic line PL2 when the resistance-change element is in a high-resistance state is expressed by $1/R_{AP}+1/R_0$.

When a resistance change type memory does not include an assist cell, on the other hand, a gradient of the characteristic line PL3 when the resistance change-change element is in a low-resistance state is expressed by $1/R_P$, and a gradient of the characteristic line PL4 when the resistance change element is in a high-resistance state is expressed by $1/R_{AP}$.

When the resistance change type memory includes an assist cell AC as in the present embodiment, a gradient of a read current relative to the bit line voltage is greater than a gradient of a read current relative to the bit line voltage of a resistance change type memory not including an assist cell.

Accordingly, a read current used in the resistance change type memory of the present embodiment relative to a certain bit line voltage $V_{BL}$ can be made greater than that of a resistance change type memory not including an assist cell.

An assist current $I_2$ of the assist cell can be regarded as a constant (zero-dimensional function) which does not substantially vary according to the resistance of the cell, relative to cell currents of a low-resistance-state cell and a high-resistance-state cell. Accordingly, a difference in cell current between the high-resistance-state cell and the low-resistance-state cell becomes the difference in read current $I_{Read}$ shown in FIG. 5.

As shown in FIG. 5, however, a difference D1 in the read current (cell current) between the high-resistance-state cell and the low-resistance-state cell in the resistance change type memory including the assist cell of the present embodiment is greater than a difference D2 in read current (cell current) between a high-resistance-state cell and a low-resistance-state cell of a general resistance change type memory (resistance change type memory not including an assist cell), relative to a certain bit line voltage $V_{BL}$.

This is because, considering the characteristics of the clamp transistor 60, the resistance change type memory of the present embodiment can drive the clamp transistor 60 which supplies the bit line BL with a read current $I_{Read}$ in a stable operation (pentode operation, for example) in a saturation region of the transistor, as indiated by operating points DP1, DP2, DP3, DP4 on the characteristic lines PL1, PL2, PL3, PL4 of FIG. 5.

Since a resistance change type memory not including an assist cell cannot increase a read current (i.e., a cell current) relative to a bit line voltage $V_{BL}$, on the other hand, the clamp transistor 60 is driven in a region close to a threshold value of the clamp transistor 60. Accordingly, in view of the operating points PL3, PL4 of the clamp transistor 60 relative to the characteristic lines PL3, PL4 of the low-resistance-state cell and the high-resistance-state cell, difference in cell current between the high-resistance-state cell and the low-resistance-state cell cannot be increased.

As described above, in the resistance change type memory of the present embodiment, by letting a part of a read current flow through the assist cell, the clamp transistor 60, designed to control supply of the read current relative to the bit line can be driven in a saturation region. As a result thereof, difference in cell current between the low-resistance-state cell and the high-resistance-state cell can be increased, and thereby a read margin of the resistance change type memory can be improved.

Further, according to the resistance change type memory of the present embodiment, since the clamp transistor 60 can be driven in a saturation region, a clamp voltage which is applied to the gate of the clamp transistor 60 can be increased. Accordingly, the resistance change type memory of the present embodiment can improve tolerance to ground noise when reading data.

FIG. 6 illustrates a simulation result of a relationship between time and a current flowing through the memory cell when a predetermined read current is used.

The horizontal axis in FIG. 6 represents time, and the vertical axis in FIG. 6 represents a current (cell current) which is supplied to the memory cell.

Characteristic line PIL1 in FIG. 6 represents a magnitude of a cell current of a low-resistance-state cell relative to a certain read current in the resistance change type memory including the assist cell according to the present embodiment. Characteristic line PIH1 in FIG. 6 represents a magnitude of a cell current of a high-resistance-state cell relative to a certain read current in the resistance change type memory including the assist cell according to the present embodiment.

Characteristic line PIL2 in FIG. 6 represents a magnitude of a cell current of a low-resistance-state cell relative to a certain read current in the resistance change type memory not including an assist cell. Characteristic line PIH2 in FIG. 6 represents a magnitude of a cell current of a high-resistance-state cell relative to a certain read current in a resistance change type memory not including an assist cell.

As described above, in the resistance change type memory including the assist cell of the present embodiment, a read current relative to a bit line voltage to be charged can be made greater than that of the resistance change type memory not including an assist cell.

Accordingly, a current difference DA in cell current between the low-resistance-state cell and the high-resistance-state cell in the resistance change type memory of the present embodiment becomes greater than a current difference DB in cell current between the low-resistance-state cell and the high-resistance-state cell of the resistance change type memory not including an assist cell. Accordingly, as shown in FIG. 6, according to the resistance change type memory of the present embodiment, a level of a signal (read signal) which is detected when data is read can be increased.

Further, as shown in FIG. 6, when a resistance change type memory includes an assist cell as in the present embodiment, since a read current which can be supplied to the bit line can be made great relative to a certain bit line voltage, a rise of the current (cell current) is fast, compared to when the resistance change type memory does not include an assist cell.

Therefore, according to the resistance change type memory of the present embodiment, an operation speed of the resistance change memory when data is read can be increased.

When the read current and the cell current are the same magnitude ($I_{Read}=I_1$) and a large read current is used in an MTJ element of an MRAM, for example, the resistance state of the MTJ element may be changed by the read current. Thereby, when a large read current is used, a large cell current is supplied to a memory cell, and reading disturb may occur. Accordingly, restrictions are imposed on the magnitude of the read current according to the characteristics of the resistance change element.

By using an access cell when data is read as in the resistance change type memory of the present embodiment, on the other hand, the magnitude of the read current can be increased without changing the magnitude of the cell current supplied to the select cell MC. Thereby, both reliability and improvement in operating characteristics of the resistance change type memory when reading data are achieved.

As elements of resistance change type memories are miniaturized, the adverse effect caused by parasitic resistance and parasitic capacitance on the operation of the resistance change element as a memory element becomes greater.

By allowing the current value of the read current $I_{Read}$ to be increased using the assist cell AC as in the resistance change type memory of the present embodiment, the effect of parasitic resistance and parasitic capacitance can be reduced, and the charging time of the bit line BL and the operation time of the sense amplifier can be reduced.

As described above, by increasing the current value of the read current $I_{Read}$ as in the present embodiment, a level of a signal (read signal) detected from the select cell can be increased. As a result thereof, the effect of parasitic resistance and parasitic capacitance on miniaturized elements can be suppressed, and the read margin and the operation speed of the resistance change type memory can be improved.

Therefore, according to the resistance change type memory of the present embodiment, operating characteristics can be improved when data is read in the resistance change type memory.

(b) Operation

The operation of the resistance change type memory according to the first embodiment will be described with reference to FIG. 7.

In the description that follows, the operation of the resistance change type memory of the present embodiment will be described with reference to FIGS. 1-3, in addition to FIG. 7, as appropriate.

A description will be given on the operation of the resistance change type memory of the present embodiment when writing data.

When data is written in the resistance change type memory, a pair of bit lines (a pair of select bit lines) to which a select cell is connected is turned active, on the basis of a command and an address signal from outside (such as a host and a controller). One bit line among two bit lines of the pair of bit lines is set to a high potential, and the other bit line (source line) is set to a low potential, according to data to be written to the memory cell MC.

At a predetermined timing (timing at which the bit line is charged to a predetermined voltage), the word line (select word line) WL to which the select cell MC is connected is activated, and a voltage of "H" level is applied to the word line WL, and a select transistor in the select cell MC is turned on.

The assist word line WL is maintained in an inactive state with respect to the assist cell AC connected to a pair of bit lines to which the select cell MC is also connected. A potential of "L" level is applied to the assist word line WL, and the assist transistor 2A in the assist cell AC is turned off when data is written to the select cell MC.

Thereby, the assist cell AC is electrically separated from the pair of select bit lines BL, bBL when data is written to the select cell MC. Thereby, a write pulse (write current) is applied only to the select cell MC.

When the resistance change type memory is an STT-MRAM, a current flowing in a direction according to data to be written is supplied to the MTJ element as the memory element (resistance-change element) 1, as shown in FIG. 2. That is, one bit line of the pair of bit lines BL, bBL is set to a high potential and the other bit line is set to a low potential, according to the direction in which the write current flows through the MTJ element. Difference in potential between the bit lines BL, bBL is set according to the magnitude of the write current $I_{WR}$, designed to reverse the direction of magnetization of the storage layer.

Writing of data in the resistance change type memory of the present embodiment is performed as described above.

Even when an assist cell AC is connected to the bit lines BL, bBL, to which a select cell is also connected, as in the present embodiment, the assist cell AC hardly causes an adverse effect on writing of data to the select cell MC.

The operation of the resistance change type memory of the present embodiment when reading data will be described with reference to FIG. 7.

FIG. 7 illustrates a timing chart of the resistance change type memory of the present embodiment when reading data.

The horizontal axis in FIG. 7 represents time, and the vertical axis in FIG. 7 represents voltage/current of each interconnect.

As shown in FIG. 7, when a request for reading data is made from outside, the read circuit 6A is turned active. The clamp transistor 60 in the read circuit 6A is turned on, and is connected to the bit line BL on the high-potential side of the pair of select bit lines. The sink transistor 65 and the sense amplifier 69 in the read circuit 6A are turned on, and are connected to the bit line BL and the source line SL (bBL), respectively. Thereby, the bit lines BL, bBL are activated at a timing earlier than that of the word line WL.

At time t1, application of a load voltage $V_{Load}$ to one end of a current path of the clamp transistor 60 is started. When voltage $V_{Load}$ reaches a predetermined value, the clamp transistor CLMP starts supplying a current (read current $I_{Read}$) to the bit line BL. The voltage of the bit line BL is increased by the current supplied from the clamp transistor CLMP.

After the read current is supplied to the bit line BL, the word line WL is activated, and the word line voltage is applied to the word line WL. At substantially the same timing as the timing at which the word line WL is activated, the assist word line AWL is activated, and an assist word line voltage is applied to the assist word line.

At time t2, when the potential of the word line WL and the assist word line AWL reaches a threshold voltage of the select transistor 2 and the assist transistor 2A, the select transistor 2 and the assist transistor 2A are turned on. Thereby, currents $I_1$, $I_2$ are supplied to the select cell MC and the assist cell AC, respectively, from the bit line BL.

A cell current $I_1$, which is a part of the read current $I_{Read}$ supplied to the bit line BL, is supplied to the select cell MC, and an assist current $I_2$, which is a part of the read current $I_{Read}$, is supplied to the assist cell AC.

Preferably, a magnitude of the gate potential $V_{CLMP}$ of the clamp transistor CLMP should be controlled and a magnitude of a current supplied to the bit line BL should be adjusted, such that the potential $V_{BL}$ of the bit line BL reaches a predetermined value at the timing (time t2) at which the select transistor 2 and the assist transistor 2A are turned on.

After the sense amplifier 600 has finished sampling the read current $I_{Read}$ (cell current $I_1$) and the standard current of the reference cell RC, the word line and the bit line are turned to an inactive state at a predetermined timing. The sense amplifier 600 determines whether the magnitude of the cell current $I_1$ is greater than a magnitude of a standard current of the reference cell RC, and data stored in the select cell MC is read.

Reading of data in the resistance change type memory of the present embodiment is performed as described above.

By letting a part of the read current $I_{Read}$ be led to the assist cell AC as in the present embodiment, the read current $I_{Read}$ which is supplied to the bit line BL can be increased without letting a large cell current $I_1$ flow through the select cell MC. Thereby, the resistance change type memory of the present embodiment is capable of increasing the charging speed of the bit line BL.

Further, in the resistance change type memory of the present embodiment, by using a large read current $I_{Read}$, difference in cell current between the high-resistance-state cell and the low-resistance-state cell can be increased, and a signal level of the read signal can be increased. Thereby, according to the resistance change type memory of the present embodiment, a read margin can be increased when reading data.

As described above, according to the operation (method of reading data) of the resistance change type memory of the first embodiment, operating characteristics of the resistance change type memory when reading data can be improved.

(2) Second Embodiment

A resistance change type memory of a second embodiment will be described with reference to FIG. 8. In the second embodiment, descriptions on the structures, functions, and operations substantially the same as those of the resistance change type memory of the first embodiment will be omitted.

FIG. 8 is an equivalent circuit diagram illustrating a circuit configuration of the resistance change type memory of the second embodiment. For the sake of clarification, FIG. 8 shows a memory cell and an assist cell connected to a pair of bit lines in an enlarged view.

As shown in FIG. 8, the resistance change type memory of the present embodiment is different from the resistance change type memory of the first embodiment in that an assist cell AC does not include a resistance element.

One end of a current path of an assist transistor 2A in the assist cell AC is directly connected to a bit line BL, and the other end of the current path of the assist transistor 2A is connected to a source line SL (bit line bBL).

In this case, the resistance element 2A of the assist cell AC is removed from the structure of the assist cell shown in FIG. 3, and a conductor such as an interconnect material or a plug material is embedded in a position of the resistance element 2A in the interlayer insulating film 79C.

When data is read in the resistance change type memory of the present embodiment, by controlling voltage $V_2$ applied to an assist word line AWL, a magnitude of an assist current $I_2$ flowing through the assist cell AC is adjusted.

Voltage $V_2$ different from voltage $V_1$ of the word line WL of the memory cell MC is applied to the assist word line AWL of the assist cell AC.

A magnitude of the voltage (assist word line voltage) $V_2$ applied to the assist word line AWL is controlled by the assist word line control unit 49 in the row control circuit 4.

When voltage $V_2$ applied to the assist word line AWL increases, the output current of the assist transistor 2A increases. When voltage $V_2$ applied to the assist word line AWL decreases, on the other hand, the output current of the assist transistor 2A decreases.

As a result thereof, the magnitude of the assist current $I_2$ flowing through the assist cell AC is adjusted according to operating characteristics required for a resistance change type memory.

Since a resistance element is not provided in the assist cell AC, a voltage drop in the assist cell AC is small, compared to the memory cell MC. Accordingly, voltage $V_2$ applied to the assist word line AWL may be equal to voltage $V_1$ applied to the word line WL, according to the magnitude of the current $I_2$ requested by the assist cell AC.

By controlling voltage $V_2$ applied to the assist word line AWL and controlling a driving force of the assist transistor 2A when data is read in the resistance change type memory, the assist transistor 2A as a control element of the assist cell AC can be substantially used as a resistance element (load element) in the assist cell AC.

In the resistance change type memory of the present embodiment, since a resistance element does not need to be provided in the assist cell AC, the size (area) of the assist cell AC on the chip can be reduced. As a result thereof, the resistance change type memory of the present embodiment can reduce the chip cost of the memory.

By allowing the magnitude of the current $I_2$ flowing through the assist cell AC to be adjusted by controlling the voltage of the assist word line AWL as in the resistance change type memory of the present embodiment, change in specifications (such as operating characteristics) of the memory after designing/manufacturing the resistance change type memory can be flexibly dealt with.

When the assist cell AC includes a resistance element as in the first embodiment, the magnitude of the assist current $I_2$ flowing though the assist cell AC may be adjusted by controlling the voltage applied to the assist word line AWL.

As described above, according to the resistance change type memory of the second embodiment, operating characteristics of the resistance change type memory when reading data can be improved.

(3) Third Embodiment

A resistance change type memory according to a third embodiment will be described with reference to FIGS. 9 and 10. In the third embodiment, descriptions on the structures, functions, and operations substantially the same as those of the resistance change type memory of the first and second embodiments will be omitted.

FIG. 9 is an equivalent circuit diagram illustrating a circuit configuration of a resistance change type memory of the third embodiment. For the sake of clarification, FIG. 9 illustrates a memory cell and an assist cell connected to a pair of bit lines in an enlarged view.

As shown in FIG. 9, the resistance change type memory of the present embodiment is different from the resistance change type memory of the first embodiment in that the other end of a current path of an assist transistor 2A of an assist cell AC is not connected to a source line SL (bit line bBL).

The other end of the current path of the assist transistor 2A of the assist cell AC is connected to a ground line different from the source line SL and grounded.

FIG. 10 is an equivalent circuit diagram illustrating a circuit configuration of a resistance change type memory of the present embodiment, with a configuration different from that of FIG. 9.

As shown in FIG. 10, in a circuit configuration in which the assist cell AC does not include a resistance element, one end of the current path of the assist transistor 2A may be directly connected to a bit line BL, and the other end of the current path of the assist transistor 2A may be grounded.

In the resistance change memory of the present embodiment shown in FIG. 9 or FIG. 10, an assist current $I_2$ of the assist cell AC flows from the assist cell AC to the ground line, without being supplied to the source line SL.

By letting the assist current $I_2$ of the assist cell AC be directly emitted to the ground line from the assist transistor 2A by bypassing the source line SL as in the present embodiment, it is possible to reduce an adverse effect of ground noise caused by the assist current $I_2$ on the cell current $I_1$ of the select cell MC.

As a result of reduction in the effect of noise on the select cell, the resistance change type memory of the present embodiment can improve reliability in reading data from the select cell MC.

In a resistance change type memory including an assist cell with the circuit configuration shown in FIGS. 9 and 10, the magnitude of the current $I_2$ flowing through the assist cell AC may be controlled by controlling the voltage applied to the assist word line AWL.

As described above, according to the resistance change type memory of the third embodiment, an effect substantially the same as those of the first and second embodiments can be obtained, and reliability in reading data in the resistance change type memory can be improved.

(4) Fourth Embodiment

A resistance change type memory according to a fourth embodiment will be described with reference to FIG. 11. In the fourth embodiment, descriptions on the structures, functions, and operations substantially the same as those of the resistance change type memory of the first to third embodiments will be omitted.

The resistance change type memory of the fourth embodiment is different from the resistance change type memory of the first to third embodiments in configuration of the memory cell array.

Figure 11:
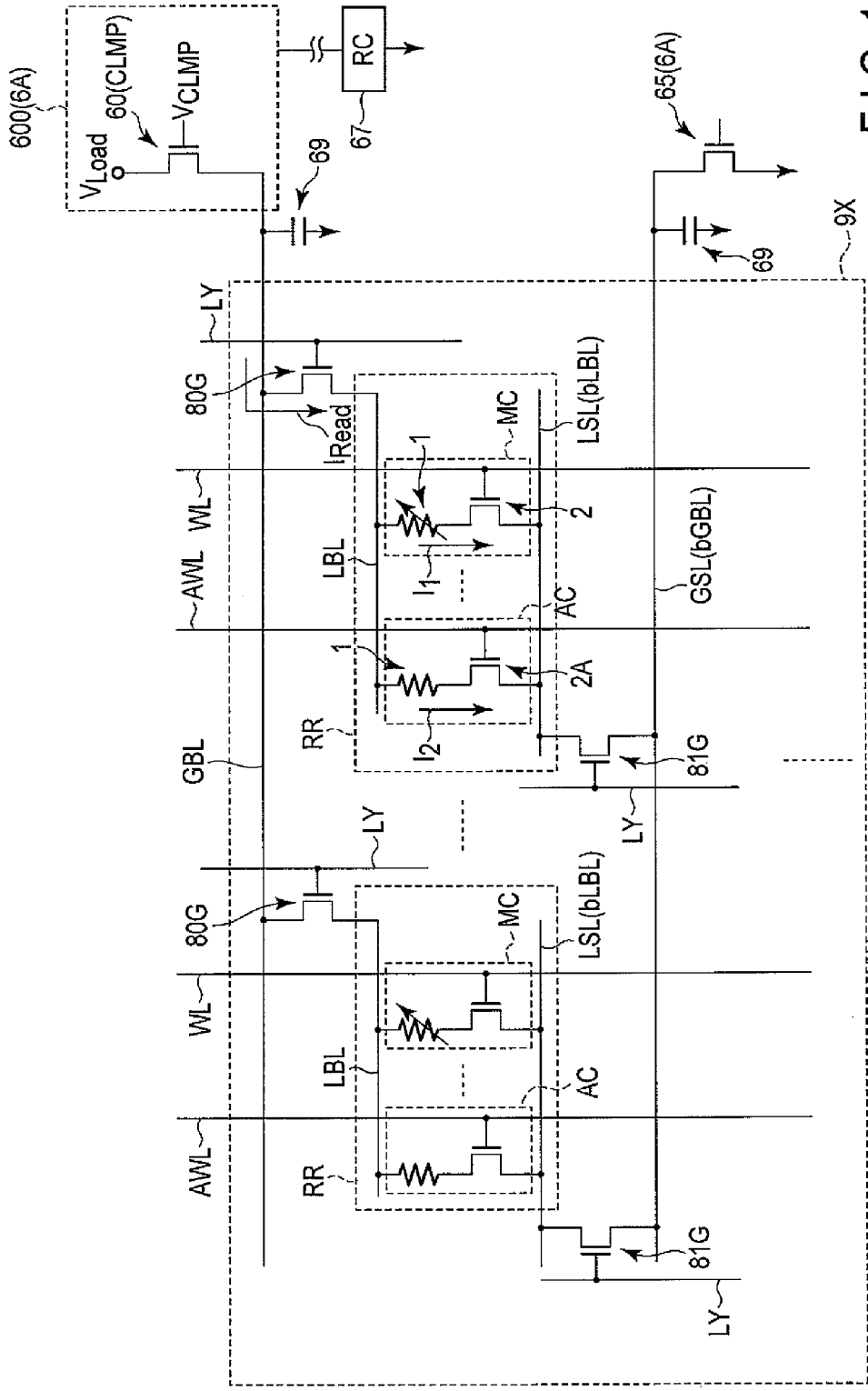
FIG. 11 illustrates an exemplary inner configuration of a resistance change type memory according to a fourth embodiment.

FIG. 11 is an equivalent circuit diagram illustrating a circuit configuration of the resistance change type memory of the present embodiment.

As shown in FIG. 11, in the resistance change type memory of the present embodiment, operations of bit lines and memory cells of a memory cell array 9A are controlled by a hierarchical bit line system.

A pair of global bit lines GBL, bGBL is provided in the memory cell array 9A. Further, a plurality of local cell arrays (also referred to as local regions or first regions) RR are provided in the memory cell array 9A. The plurality of local cell arrays RR are arranged along a direction in which the global bit lines GBL, bGBL extend in a memory cell array 9X.

The global bit lines GBL, bGBL are shared among the plurality of local cell arrays RR.

In each of the local cell arrays RR, at least one pair of bit lines LBL, bLBL is provided, as in the configuration of the memory cell array shown in FIG. 1. In the description that follows, the bit lines in the local cell array RR will be referred to as local bit lines LBL, bLBL.

The bit line BL, which is one of the pair of bit lines BL, bBL, is connected to the global bit line GBL via a select element (hereinafter referred to as a local array select switch) 80G.

The other bit line bBL, which is the other of the pair of bit lines BL, bBL, is connected to the global bit line bGBL via a select element (local array select switch) 81G.

A plurality of memory cells MC and at least one assist cell AC are connected to each of the pair of bit lines BL, bBL of the local cell array RR, as in the connection relationship between the cells MC, AC and the bit lines BL, bBL shown in FIG. 1.

In FIG. 11, the assist cell AC includes a resistance element 1A. An assist cell AC not including a resistance element may be connected to the global bit lines GBL, bGBL via the local bit lines LBL, bLBL in the local cell array RR.

In FIG. 11, a current path of an assist transistor 2A of the assist cell AC is connected to the local bit line bLBL (local source line LSL). Alternatively, the current path of the assist transistor 2A of the assist cell AC may be connected to a ground line (not shown).

As described above, each of the local cell arrays RR is connected between the global bit lines GBL, bGBL via the local array select switches 80G, 81G, respectively.

Connection between the global bit lines GBL, bGBL and the local bit lines LBL, bLBL, i.e., switching between ON and OFF states of the local array select switches 80G, 81G is performed by controlling a potential of a control line (hereinafter referred to as a local array select line) LY.

For example, when a plurality of pairs of bit lines LBL, bLBL are provided in one local cell array RR, a select element (hereinafter referred to as a column select switch) is provided between a current path of the local select switches 80G, 81G and each of the bit lines LBL, bLBL. Thereby, one pair of bit lines LBL, bLBL selected from the plurality of pairs of bit lines in the local cell array RR can be made active.

An inner configuration of the memory cell array using hierarchical bit lines is not limited to the example shown in FIG. 11.

When the length of the bit lines increases as the number of cells in the memory cell array increases, increase in interconnect delay and decrease in manufacturing yield caused by increase in the interconnect length can be suppressed by applying the hierarchical bit line system to the memory cell array.

As shown in FIG. 11, in the resistance change type memory using hierarchical bit lines of the present embodiment, a read circuit 6A is connected to the global bit lines GBL, bGBL when data is read.

One end of a current path of a clamp transistor 60 is connected to the global bit line GBL set to a high potential. A load voltage $V_{Load}$ is applied to the other end of the current path of the clamp transistor 60. A clamp voltage $V_{CLMP}$ is applied to a gate of the clamp transistor 60.

One end of a current path of a sink transistor 65 is connected to the global bit line (global source line) bGBL set to a low potential. The other end of the current path of the sink transistor 65 is grounded.

In the resistance change type memory using the hierarchical bit line system of the present embodiment, an operation of reading data is substantially the same as the operation shown in FIG. 7.

At the start of reading of data, the global bit line GBL on the high-potential side is connected to the sense amplifier 600 and the clamp transistor 60, and the global bit line bGBL (global source line GSL) on the low-potential side is connected to the sink transistor 65.

At a timing before the select word line WL is activated, for example, a voltage of "H" level is applied to the local select line LY, and the local select switches 80G, 81G are turned on. Thereby, the local cell array RR is connected to the global bit lines GBL, bGBL.

After that, a voltage of "H" level is applied to a select word line WL and an assist word line AWL, and the select transistor 2 and the assist transistor 2A are turned on.

A read current $I_{Read}$ is supplied from the global bit line GBL to the local bit line LBL, a cell current $I_1$ flows through the select cell MC, and an assist current $I_2$ flows through the assist cell AC.

The cell current $I_1$ and the assist cell $I_2$ are emitted to the global source line GSL via the local bit line bBL.

After that, the word line WL, assist word line AWL, the bit lines BL, bBL, and the global bit lines GBL, bGBL are sequentially inactivated by an operation substantially the same as the operation described with reference to FIG. 7.

Reading of data in the resistance change type memory of the present embodiment is completed by the above-described operation.

Writing of data in the resistance change type memory of the present embodiment is different from reading of data in the resistance change type memory of the present embodiment only in that the assist cell AC connected to the pair of select bit lines is not turned on, and hence descriptions thereof will be omitted.

As described above, by letting the resistance change type memory to which the hierarchical bit line system is applied include the assist cell AC which is driven in a reading operation, as well as the memory cell MC, as in the present embodiment, the read current $I_{Read}$ which is supplied to the local bit line LBL from the global bit line GBL can be increased.

As a result thereof, the resistance change type memory to which the hierarchical bit line system is applied according to the present embodiment can achieve improvement in operation margin and increase in operation speed when reading, as in the above-described embodiments.

Accordingly, according to the resistance change type memory of the hierarchical bit line system of the fourth embodiment, the operating characteristics of the resistance change type memory can be improved when reading.

(5) Fifth Embodiment

A resistance change type memory according to a fifth embodiment will be described with reference to FIGS. 12 to 14. In the fifth embodiment, descriptions on the structures, functions, and operations substantially the same as those of the resistance change type memory of the first to fourth embodiments will be omitted.

Figure 12:
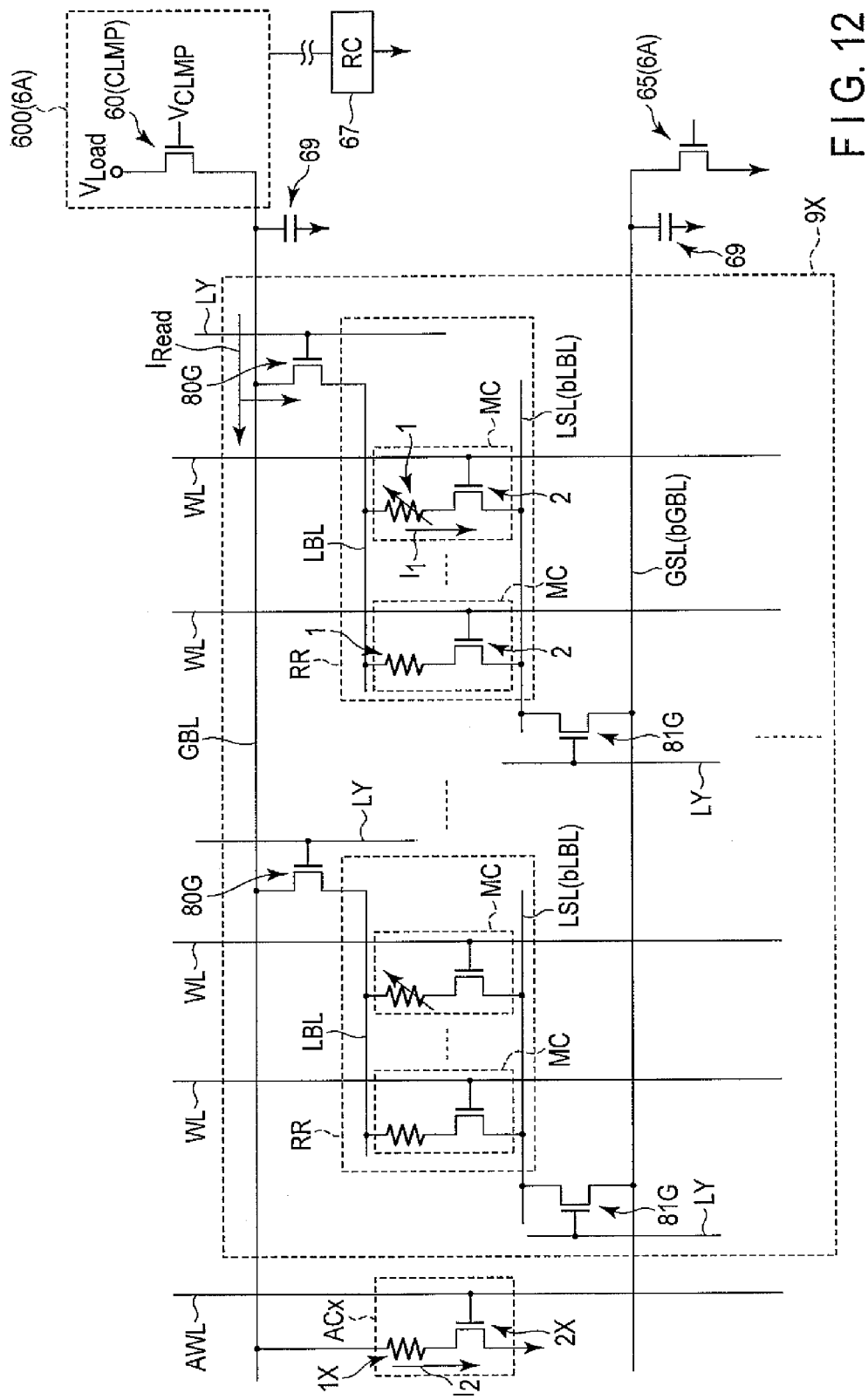
FIG. 12 illustrates an exemplary inner configuration of a resistance change type memory according to a fifth embodiment.

FIG. 12 is an equivalent circuit diagram illustrating a circuit configuration of the resistance change type memory of the present embodiment.

As shown in FIG. 12, an assist cell AC included in the resistance change type memory of the present embodiment is provided in a region (second region) outside a memory cell array 9A.

The assist cell AC of the resistance change type memory of the present embodiment is provided in a peripheral region in which column control circuits 3A, 3B and a row control circuit 4 are provided, a dummy region provided between the memory cell array 9A and the peripheral region, or a region in which a reference cell is provided.

In the present embodiment, as shown in FIG. 12, the assist cell AC is directly connected to the global bit line GBL.

In this case, a material and a structure of a resistance element 1X in the assist cell AC can be made different from those of a resistance-change element 1 in a memory cell MC.

Figure 13:
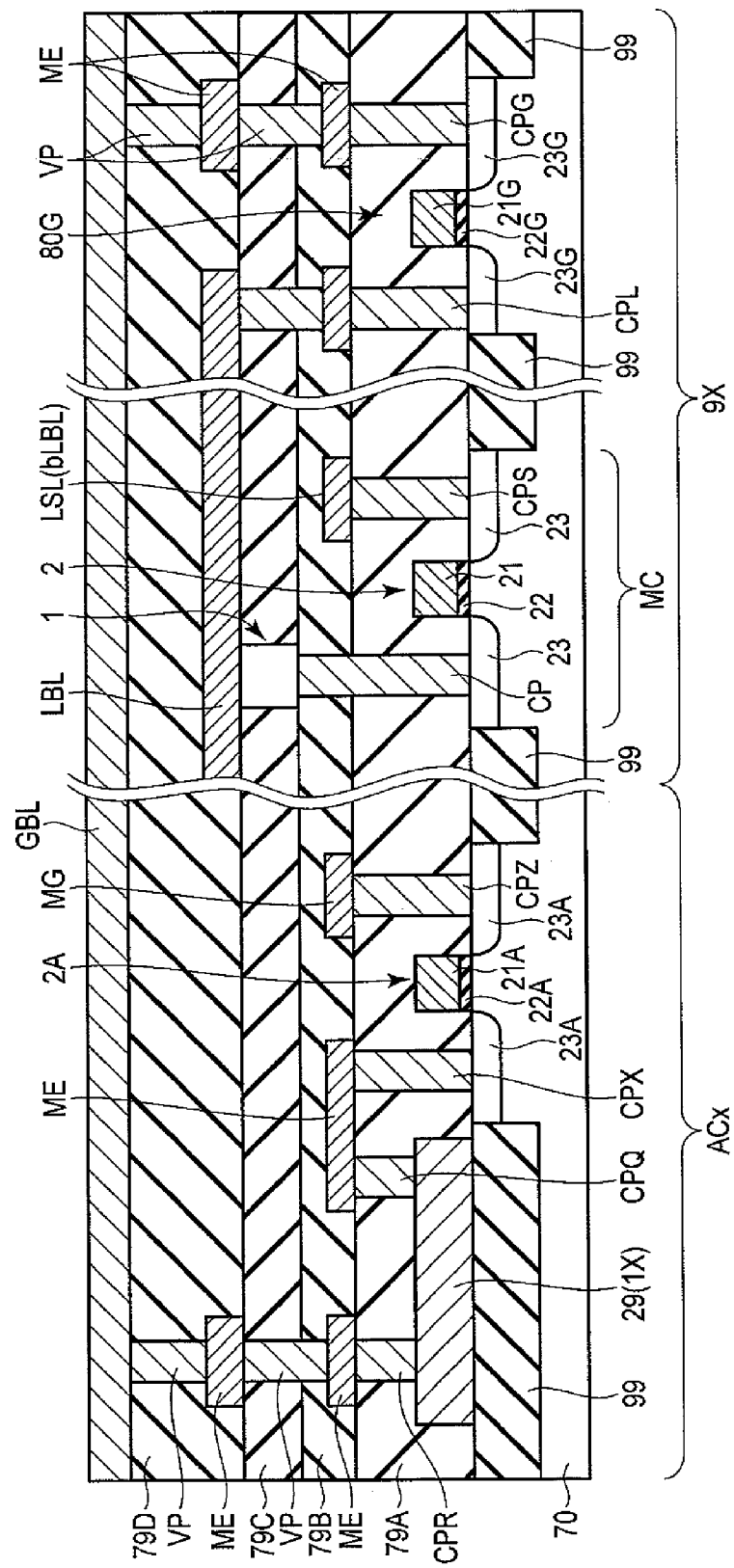
FIG. 13 is a cross-sectional view illustrating an exemplary structure of the resistance change type memory according to the fifth embodiment.

FIG. 13 is a cross-sectional view illustrating an exemplary structure of the resistance change type memory of the present embodiment.

As shown in FIG. 13, for example, the resistance-change element 1 and a select transistor 2 of the memory cell MC are provided in an active region of the memory cell array 9A, as in the structure described with reference to FIG. 3.

A bit line BL, to which the memory cell MC is connected, is connected to the global bit line GBL via a transistor 80G as a local select element, and a plurality of plugs CPL, CPG, VP and intermediate interconnect ME in interlayer insulating films 79A, 79B, 79C, 79D.

The transistor 80G includes a gate insulating film 22G on a semiconductor substrate 70, a gate electrode 21G on the gate insulating film 22G, and a source and a drain 23G provided in the semiconductor substrate (active region) 70. The transistor 80G as the local array select element provided in a memory cell array 9X is formed at substantially the same time with the select transistor 2, for example.

An assist transistor 2A provided in a region outside the memory cell array 9X has a structure substantially the same as that of the assist transistor 2A shown in FIG. 3, for example.

As shown in FIG. 13, on the other hand, a resistance element 1X of the assist cell AC is formed of a silicon layer (or a poliside layer) 29. The polysilicon layer 29 as the resistance element 1X is provided on an insulating film 99 in the semiconductor substrate 70, for example.

One end of the polysilicon layer 29 as the resistance element 1X is connected to the global bit line GBL via a contact plug CPR on the silicon layer 29 and the plug VP and intermediate interconnect ME in the interlayer insulating films 79A, 79B, 79C, 79D, for example. The other end of the polysilicon layer 29 as the resistance element 1X is connected to one end of a current path of an assist transistor 2A via a plurality of plugs CPQ, XPX and the intermediate interconnect ME. The other end of the current path of the assist transistor 2A is connected to a ground line MG via a contact plug CPZ.

The polysilicon layer 29 as the resistance element 1X is formed at the same time with a resistance element used in a peripheral circuit and a gate electrode of the transistor, for example. A diffusion layer (semiconductor region) provided in the semiconductor substrate 70 may be used as the resistance element 1X of the assist cell AC. By forming the resistance element 1X of the assist cell AC of a material same as that of the element of the peripheral circuit, the assist cell AC can be applied to the resistance change type memory of the hierarchical bit line system in a relatively easy manner.

Variation in the resistance of the resistance element in the assist cell AC causes variation in read current which is supplied to the bit line BL. This can cause decrease in reliability in reading data and variation in operation speed when reading.

By using a structure and a material different from those of the resistance-change element 1 of the memory cell MC in the resistance element 1X of the assist cell AC, variation among resistance elements 1X of a plurality of assist cells AC provided on the same chip can be prevented.

Further, by adjusting dimensions of the polysilicon layer 29 as the resistance element 1X, the resistance of the resistance element 1X of the assist cell AC can be controlled. By controlling the resistance of the resistance element 1X, a magnitude of the read current $I_{Read}$ and a magnitude of the assist current $I_2$ of the assist cell can be adjusted. As described above, a magnitude of the resistance value of the resistance element 1X of the assist cell AC should preferably be set as appropriate to reduce power consumption of the resistance change type memory or increase operation speed (for example, charging speed in interconnect), for example. For example, the magnitude of the resistance value of the resistance element 1X of the assist cell AC may be set to an intermediate value ($R_{AP}/2+R_P/2$, for example) between the resistance value $R_{AP}$ of the resistance-change element 1 in a high-resistance state and the resistance value $R_P$ of the resistance-change element 1 in a low-resistance state.

When the assist cell AC is provided in a region outside the memory cell array 9X as in the present embodiment, since variation in resistance value and the magnitude of the resistance value of the resistance element 1X in the assist cell can be controlled without being restricted as to the structure and the material of the element used as the memory cell MC, the operation of the resistance change type memory can be stabilized.

When the assist cell AC is provided in the same region as a reference cell, the structures of the resistance element and the assist transistor in the assist cell AC may be substantially the same as the structures of the resistance element and the transistor in the reference cell.

FIG. 14 is an equivalent circuit diagram illustrating a modification of a resistance change type memory according to the present embodiment.

As shown in FIG. 14, the assist cell AC connected to the global bit line GBL does not need to include a resistance element, as in the configuration of the assist cell described in the second embodiment.

By controlling an application voltage to the assist word line AWL, the assist transistor 2A in the assist cell AC is used as a load element in substantially the same way as the resistance element.

In the assist cell AC of the resistance change type memory shown in FIG. 14, one end of a current path of the assist transistor 2A is directly connected to the global bit line GBL, and the other end of the current path of the assist transistor 2A is connected to the ground line. Thereby, the effect of ground noise caused by the assist current $I_2$ on the cell current $I_1$ (and the read current) of the select cell MC can be reduced.

When the assist cell AC is provided in a region outside the memory cell array 9X as shown in FIGS. 12 and 13, the voltage applied to the assist word line AWL may be made equal to or different from the voltage applied to the word line WL.

When the assist cell AC is provided in a region outside the memory cell array 9X, only one assist cell AC may be connected to one global bit line GBL (or a pair of global bit lines GBL, bGBL).

The assist cell AC connected to a pair of bit lines BL, bBL to which a memory cell MC is also connected in the first to third embodiments may be provided in a region outside the memory cell array and have a structure (structure of the assist cell shown in FIG. 13, for example) different from a structure of the memory cell MC.

Further, the structure of the assist transistor 2A may be different from the structure of the select transistor 2. For example, a gate length (channel length) or a gate width (channel width) of the assist transistor 2A may be different from a gate length or a gate width of the select transistor 2. Alternatively, when the select transistor 2 is an RCAT or a FinFET, the assist transistor 2A may be a transistor with a planar structure.

As described above, according to the resistance change type memory of the fifth embodiment, an effect substantially the same as those of the first to fourth embodiments is obtained.

(3) Modification

In the description given above, an MRAM using an MTJ element as a memory element (variable resistance element) has been taken as an example of the resistance change type memory.

The resistance change type memory of the present embodiment, however, is not limited thereto and may also be an ReRAM (resistive RAM), a PCRAM (phase-change RAM), an ion memory, or the like.

The memory element of a ReRAM is a variable resistance element using a metal oxide or a perovskite oxide. A resistance state of the memory element of the ReRAM changes by changing the pulse width (application period of a pulse) and amplitude (current/voltage) of a write pulse, and polarity (direction of application) of the write pulse.

In a PCRAM, a phase-change element using chalcogenide, for example, is used as a memory element. The resistance state of the memory element of the PCRAM changes when a film of the phase-change element is turned into a crystal state or an amorphous state by heat generated by a write current.

An inner configuration of the ReRAM, the PCRAM, and the ion memory includes an assist cell which is driven (turned on) together with a select cell when data is read, as described in the embodiments. Reading of data in a ReRAM, a PCRAM, and an ion memory is performed by an operation substantially the same as the operation described in the present embodiment.

Thereby, characteristics and reliability of the resistance change type memory using a ReRAM, a PCRAM, or an ion memory when reading data are improved.

Further, the memory cell array of the resistance change type memory of the present embodiment may be a cross-point memory. A vertical transistor or a non-ohmic element (such as a diode) may be used as select element of a memory cell of a cross-point memory cell array. A resistance change type memory using a cross-point memory cell array can perform the read operation described in the embodiments.

[Others]

The resistance change type memory of the above-described embodiments is used as a substitute memory for a DRAM, an SRAM, and the like.

For example, the resistance change type memory of the present embodiment can be applied as a cache memory or a buffer memory of a storage element such as a solid-state drive (SSD).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change type memory comprising:
   a first bit line and a second bit line extending in a first direction;
   a first word line extending in a second direction;
   a control line extending in the second direction;
   a memory cell connected between the first and second bit lines and including a variable resistance element as a memory element and a first select element including a first control terminal connected to the first word line; and
   a circuit connected to the first bit line and including a second select element, the second select element including a second control terminal connected to the control line, wherein one end of the second select element is connected to a ground line,
   wherein, when reading data from the memory cell, a read current is supplied to the first bit line, the memory cell and the circuit are turned on, a first current included in the read current is supplied to the memory element and the first select element, and a second current included in the read current is supplied to the second select element.

2. The resistance change type memory according to claim 1, wherein the other end of the second select element is connected to the first bit line.

3. The resistance change type memory according to claim 1, wherein, when reading data from the memory cell, a first voltage is applied to the first word line and the control line, and the first and second select elements are driven.

4. The resistance change type memory according to claim 1, wherein, when reading data from the memory cell, a first voltage is applied to the first word line and the first select element is driven, and a second voltage different from the first voltage is applied to the first control line and the second select element is driven.

5. The resistance change type memory according to claim 1, further comprising:
   a first transistor connected to the first bit line and configured to control a voltage of the first bit line when data is read from the memory cell; and
   a second transistor connected to the second bit line and configured to absorb the read current.

6. The resistance change type memory according to claim 1, wherein, when writing data to the memory cell, the memory cell is turned on, the circuit is turned off, a write current flowing between the first and second bit lines is supplied to the memory element and the first select element, and the circuit is electrically separated from the first and second bit lines.

7. A resistance change type memory comprising:
   a first global bit line and a second global lines line provided in a memory cell array and extending in a first direction;
   a plurality of first regions provided in the memory cell array, each of the plurality of first regions including: at least one first bit line connected to the first global bit line via a first control element; at least one second bit line connected to the second global bit line via a second control element; and a memory cell connected between the first and second bit lines, the memory cell including a resistance-change element as a memory element and a first select element;
   a second region provided outside the memory cell array;
   at least one circuit including a second select element connected to the first global bit line, the circuit provided in the second region;
   a first word line connected to a first control terminal of the first select element; and
   a control line connected to a second control terminal of the second select element,
   wherein, when reading data from the selected memory cell, one of the first regions in which the selected memory cell is provided is connected to the first and second global bit lines, the read current is supplied to the first bit line to which the selected memory cell is connected from the first global bit line, the memory cell and the circuit are turned on, a first current included in the read current is supplied to the memory element and the first select element, and a second current included in the read current is supplied to the second select element.

8. The resistance change type memory according to claim 7, wherein the circuit includes a resistance element, and the resistance element includes a first terminal connected to the first global bit line and a second terminal connected to one end of the second select element.

9. The resistance change type memory according to claim 7, wherein the circuit includes a resistance element, and the resistance element has a structure different from a structure of the resistance-change element.

10. The resistance change type memory according to claim 7, wherein one end of the second select element is connected to the first global bit line and the other end of the second select element is connected to a ground line.

11. The resistance change type memory according to claim 7, wherein, when reading data from the memory cell, a first voltage is applied to the selected word line and the first select element is driven, and a second voltage different from the first voltage is applied to the control line and the second select element is driven.

12. The resistance change type memory according to claim 7, further comprising:
a first transistor connected to the first global bit line and configured to control a voltage of the first global bit line when reading data from the memory cell; and
a second transistor connected to the second global bit line and configured to absorb the read current.

13. The resistance change type memory according to claim 7, wherein, when writing data to the memory cell, the first and second control elements of one of the first regions in which the selected memory cell is provided are turned on, the memory cell is turned on, the circuit is turned off, a write current flowing between the first and second bit lines is supplied to the memory element and the first select element, and the circuit is electrically separated from the first and second global bit lines.

14. A resistance change type memory comprising:
a first global bit line and a second global bit line provided in a memory cell array and extending in a first direction;
a plurality of first regions provided in the memory cell array, each of the plurality of first regions including: at least one first bit line connected to the first global bit line via a first control element; at least one second bit line connected to the second global bit line via a second control element; and a memory cell connected between the first and second bit lines, the memory cell including a resistance-change element as a memory element and a first select element;
at least one circuit including a second select element, one end of the second select element connected to the first global bit line and the other end of the second select element connected to a ground line;
a first word line connected to a first control terminal of the first select element; and
a control line connected to a second control terminal of the second select element,
wherein, when reading data from the selected memory cell, one of the first regions in which the selected memory cell is provided is connected to the first and second global bit lines, the read current is supplied to the first bit line to which the selected memory cell is connected from the first global bit line, the memory cell and the circuit are turned on, a first current included in the read current is supplied to the memory element and the first select element, and a second current included in the read current is supplied to the second select element.

15. The resistance change type memory according to claim 14, wherein, when reading data from the memory cell, a first voltage is applied to the selected word line and the first select element is driven, and a second voltage different from the first voltage is applied to the control line and the second select element is driven.

16. The resistance change type memory according to claim 14, further comprising:
a first transistor connected to the first global bit line and configured to control a voltage of the first global bit line when reading data from the memory cell; and
a second transistor connected to the second global bit line and configured to absorb the read current.

17. The resistance change type memory according to claim 14, wherein, when writing data to the memory cell, the first and second control elements of one of the first regions in which the selected memory cell is provided are turned on, the memory cell is turned on, the circuit is turned off, a write current flowing between the first and second bit lines is supplied to the memory element and the first select element, and the circuit is electrically separated from the first and second global bit lines.

* * * * *